(12) United States Patent
Sughrue et al.

(10) Patent No.: US 12,056,876 B2
(45) Date of Patent: *Aug. 6, 2024

(54) PROCESSING OF BRAIN IMAGE DATA TO ASSIGN VOXELS TO PARCELLATIONS

(71) Applicant: Omniscient Neurotechnology Pty Limited, Sydney (AU)

(72) Inventors: Michael Edward Sughrue, Sydney (AU); Stephane Philippe Doyen, Glebe (AU); Charles Teo, Sydney (AU)

(73) Assignee: Omniscient Neurotechnology Pty Limited, Sydney (AU)

( * ) Notice: Subject to any disclaimer, the term of this patent is extended or adjusted under 35 U.S.C. 154(b) by 360 days.

This patent is subject to a terminal disclaimer.

(21) Appl. No.: 17/343,699

(22) Filed: Jun. 9, 2021

(65) Prior Publication Data
US 2021/0295520 A1    Sep. 23, 2021

Related U.S. Application Data

(63) Continuation of application No. 17/066,171, filed on Oct. 8, 2020, now Pat. No. 11,055,849.

(30) Foreign Application Priority Data

Oct. 18, 2019 (AU) ................. 2019903932

(51) Int. Cl.
*G01R 33/563* (2006.01)
*G01R 33/56* (2006.01)
(Continued)

(52) U.S. Cl.
CPC ........ *G06T 7/0014* (2013.01); *G01R 33/5608* (2013.01); *G01R 33/56341* (2013.01);
(Continued)

(58) Field of Classification Search
CPC ............ G01R 33/4806; G01R 33/5608; G01R 33/56341; G06T 2200/04;
(Continued)

(56) References Cited

U.S. PATENT DOCUMENTS 8,742,754 B2 * 6/2014 Hasan ................ G01R 33/5608
324/307
9,747,421 B2 * 8/2017 Krishna ............... A61B 5/4094
(Continued)

FOREIGN PATENT DOCUMENTS

| CN | 102947862 | 2/2013 |
|----|-----------|--------|
| CN | 105636541 | 6/2016 |

(Continued)

OTHER PUBLICATIONS

Christian Lambert,"Confirmation of functional zones within the human subthalamic nucleus: Patterns of connectivity and sub-parcellation using diffusion weighted imaging," Dec. 8, 2011, NeuroImage 60 (2012) 83-94, pp. 83-92.*

(Continued)

*Primary Examiner* — Omar S Ismail
(74) *Attorney, Agent, or Firm* — Fish & Richardson P.C.

(57) ABSTRACT

A method (400) including: determining (702) a registration function [705, Niirf(T1)] for the particular brain in a coordinate space, determining (706) a registered atlas [708, Ard(T1)] from the registration function and an HCP-MMP1 Atlas (102) containing a standard parcellation scheme, performing (310, 619) diffusion tractography to determine a set [621, DTIp(DTI)] of brain tractography images of the particular brain, for a voxel in a particular parcellation in the registered atlas, determining (1105, 1120) voxel level tractography vectors [1123, Vje, Vjn] showing connectivity of the voxel with voxels in other parcellations, classifying (1124) the voxel based on the probability of the voxel being (Continued)

part of the particular parcellation, and repeating (413) the determining of the voxel level tractography vectors and the classifying of the voxels for parcellations of the HCP-MMP1 Atlas to form a personalised brain atlas [1131, PBs Atlas] containing an adjusted parcellation scheme reflecting the particular brain (Bbp).

19 Claims, 17 Drawing Sheets

(51) Int. Cl.
    *G06T 7/00* (2017.01)
    *G06T 7/30* (2017.01)
(52) U.S. Cl.
    CPC ...... *G06T 7/30* (2017.01); *G06T 2207/10088* (2013.01); *G06T 2207/20076* (2013.01); *G06T 2207/20081* (2013.01); *G06T 2207/30016* (2013.01)
(58) Field of Classification Search
    CPC . G06T 2207/10088; G06T 2207/10092; G06T 2207/20076; G06T 2207/20081; G06T 2207/30016; G06T 7/0012; G06T 7/0014; G06T 7/30
    See application file for complete search history.

(56) References Cited

U.S. PATENT DOCUMENTS

| | | | |
|---|---|---|---|
| 10,032,281 | B1 | 7/2018 | Ghesu et al. |
| 10,088,544 | B2 | 10/2018 | Cetingul et al. |
| 2010/0004527 | A1* | 1/2010 | Dale ............... G01R 33/56341 600/410 |
| 2010/0303318 | A1* | 12/2010 | Benali .................. G06T 7/0012 382/131 |
| 2011/0199084 | A1* | 8/2011 | Hasan ...................... G06T 1/00 324/309 |
| 2012/0322068 | A1* | 12/2012 | Lee ...................... A61B 5/7275 600/411 |
| 2013/0102877 | A1* | 4/2013 | Mori ......................... G06T 7/11 382/128 |
| 2015/0227702 | A1* | 8/2015 | Krishna ............... A61B 5/7257 705/2 |
| 2016/0192889 | A1* | 7/2016 | Koutsouleris .......... G16H 50/70 600/410 |
| 2017/0035320 | A1* | 2/2017 | Verma .................. A61B 5/0042 |
| 2017/0039708 | A1* | 2/2017 | Henry .................. A61B 5/4041 |
| 2017/0052241 | A1* | 2/2017 | Cetingul .......... G01R 33/56341 |
| 2018/0025489 | A1* | 1/2018 | Tiwari ............... G01R 33/5602 600/420 |
| 2020/0051255 | A1* | 2/2020 | Frank ...................... G06F 18/00 |

FOREIGN PATENT DOCUMENTS

| | | |
|---|---|---|
| CN | 108460783 | 8/2018 |
| CN | 109509193 | 3/2019 |
| CN | 109978871 | 7/2019 |
| EP | 1990768 | 11/2008 |
| WO | WO 2014/153466 | 9/2014 |

OTHER PUBLICATIONS

Huaigui Liu, "Connectivity-Based Parcellation of the Human Frontal Pole with Diffusion Tensor Imaging," Mar. 6, 2013, The Journal of Neuroscience, Apr. 17, 2013, 33(16), pp. 6782-6788.*
Jinping Xu, "Tractography-based Parcellation of the Human Middle Temporal Gyrus," Dec. 22, 2015, Scientific Reports|5: 18883|DOI: 10.1038/srep18883, pp. 1-5.*
Heidi Johansen-Berg, "Functional—Anatomical Validation and Individual Variation of Diffusion Tractography-based Segmentation of the Human Thalamus," Jul. 6, 2004, Cerebral Cortex Jan. 2005; 15:doi: 10.1093/cercor/bhh 105,pp. 31-36.*
Elena Najdenovska, "In-vivo probabilistic atlas of human thalamic nuclei based on diffusion weighted magnetic resonance imaging," Nov. 27, 2018, Scientific Data | 5:180270 | DOI: 10.1038/sdata. 2018.270, pp. 1-9.*
S. Jbabdi, "Multiple-subjects connectivity-based parcellation using hierarchical Dirichlet process mixture models," Sep. 19, 2008, NeuroImage 44 (2009), pp. 373-381.*
Yu Jin, "Scalable Algorithms for Generating and Analyzing Structural Brain Networks with a Varying Number of Nodes," Sep. 13, 2016, arXiv:1609.03893v1 [cs.CE],pp. 1-9.*
A.W. Toga, "The role of image registration in brain mapping," Jun. 27, 2000, Image and Vision Computing 19 (2001),pp. 3-19.*
Cook et al., "An Automated Approach to Connectivity-Based Partitioning of Brain Structures," 18th International Conference, Oct. 26, 2005, 8 pages.
Extended European Search Report in European Appln No. 20876723. 6, dated Nov. 10, 2022, 11 pages.
Jin et al., "Scalable Algorithms for Generating and Analyzing Structural Brain Networks with a Varying Number of Nodes," ARXIV.org, Sep. 13, 2016, 15 pages.
Wang et al., "Connectivity-Based Brain 1, 2, 4-15 Parcellation," Neuroinformatics, Oct. 3, 2015, 14(1): 83-97.
Coalson et al., "The impact of traditional neuroimaging methods on the spatial localization of cortical areas." Proceedings of the National Academy of Sciences, 2018, 115.27:E6356-65.
Dipy.org [online], "Introduction to Basic Tracking," retrieved on Dec. 2, 2020, retrieved from URL <https://dipy.org/documentation/ 1.3.0./examples_built/tracking_introduction_eudx/#example-tracking-introduction-eudx?>, 8 pages.
Najdenovska et al., "In-vivo probabilistic atlas of human thalamic nuclei based on diffusion-weighted magnetic resonance imaging," Scientific Data, Nov. 2018, 5:180270.
PCT International Search Report and Written Opinion in International Appln. No. PCT/AU2020/051093, Nov. 10, 2020, 10 pages.
pypi.org, [online] "DeepDefacer: Automatic Removal of Facial Features via Deep Learning" Jan. 13, 2019, retrieved on Dec. 2, 2020, retrieved from URL <https://pypi.org/project/deepdefacer/>, 4 pages.
Toga et al., "The role of image registration in brain mapping"; Image Vis Comput., Jan. 2001, 19(1-2): 3-24.
Yao, "Research on magnetic resonance diffusion tensor image processing technology in neuronavigation," Thesis for the degree of Doctor of Biomedical Engineering, Fudan University, 2011, 94 pages (English abstract only).

* cited by examiner

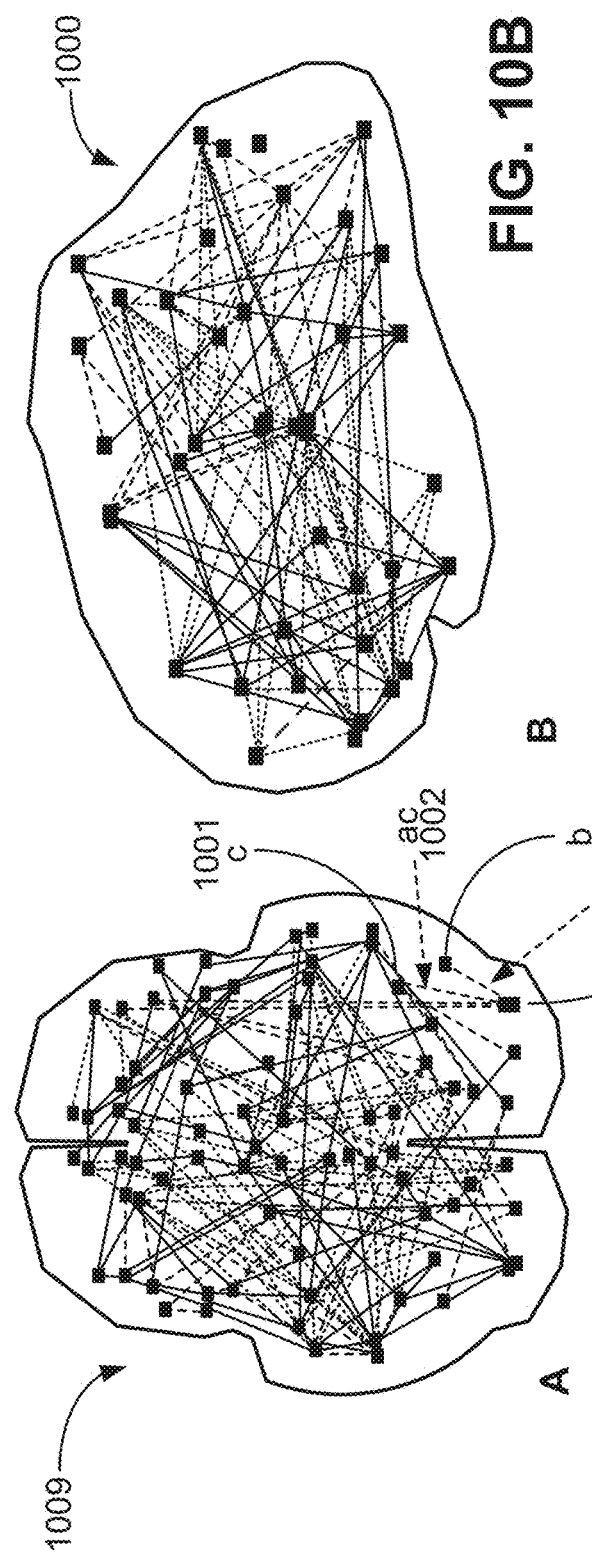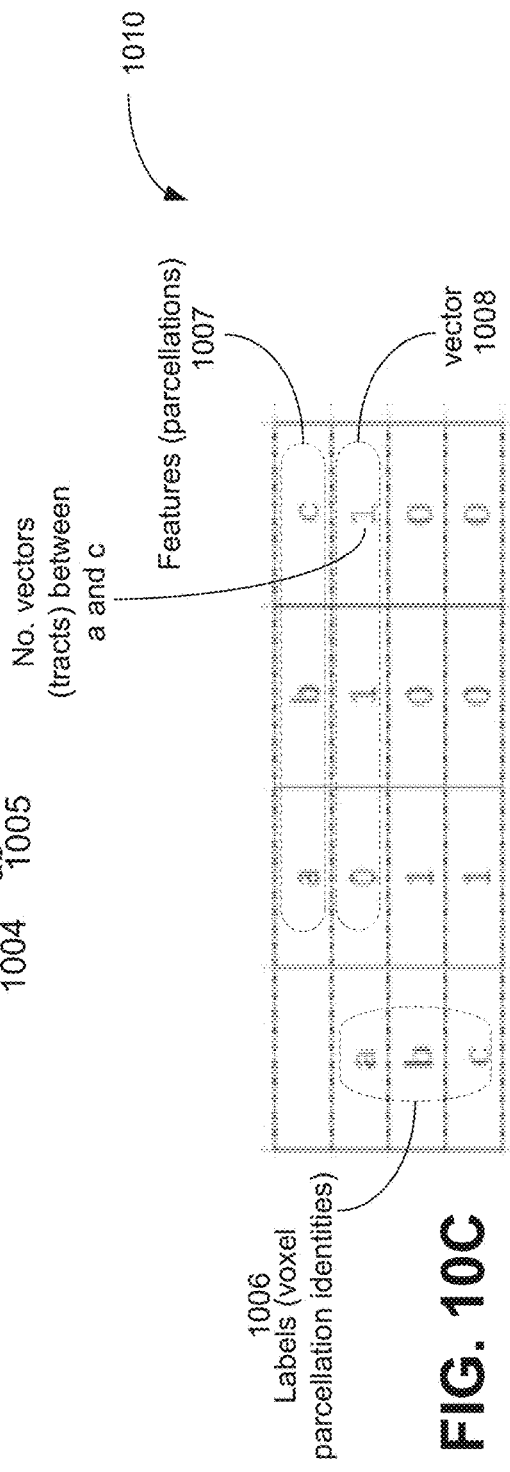
FIG. 10A
FIG. 10B
FIG. 10C

PROCESSING OF BRAIN IMAGE DATA TO ASSIGN VOXELS TO PARCELLATIONS

CROSS-REFERENCE TO RELATED APPLICATIONS

This application is a continuation of, and claims priority to, U.S. patent application Ser. No. 17/066,171, filed Oct. 8, 2020, which claims priority to Australian Provisional Patent Application No. 2019903932, filed Oct. 18, 2019, entitled "Image Processing Method and Apparatus" and listing Stephane Doyen, Michael Sughrue and Charles Teo as inventors. The disclosure of the foregoing U.S. patent application Ser. No. 17/066,171, filed Oct. 8, 2020, is incorporated here by reference in its entirety.

This application is related to U.S. Patent Application entitled "Differential Brain Network Analysis" listing Stephane Doyen and Michael Sughrue as inventors and filed on the same day as the present application and incorporated by reference herein in its entirety.

TECHNICAL FIELD

The present invention relates generally to image processing and, in particular, to processing of images of a subject brain generated by Magnetic Resonance Imaging systems. The present invention also relates to a method and apparatus for processing images, and to a computer program product including a computer readable medium having recorded thereon a computer program for processing images.

BACKGROUND

Medical imaging using functional magnetic resonance imaging (fMRI) and diffusion tensor imaging (DTI) provide insights into the functional activity and structural connections of the brain, respectively. However, present imaging systems are cumbersome to use and operate, and typically produce outputs which lack clinical usefulness.

SUMMARY

It is an object of the present invention to substantially overcome, or at least ameliorate, one or more disadvantages of existing arrangements.

Brain surgery often involves making cuts into the brain. In order to perform brain surgery, one can use a standard atlas containing a standard parcellation scheme, regardless of the specifics of the particular brain being considered. The term "parcellation" refers to the process of delineating regions of the brain which have similar properties between individuals, such as functional activity, cytoarchitecture and structural connectivity. In this nomenclature, a "parcellation" is a region of the brain (e.g., cortex) which can be shown to have similar properties across individuals, even if the exact boundaries may differ. Parcellating a brain is a useful mechanism for analyzing neuroimaging data as it reduces the complexity of the brain's activity to a finite number of domains, which can be assumed to play somewhat uniform functions. The lack of precise parcellation information relating to the particular brain in question can, when surgery is performed, lead to collateral damage to cognition. One can align an atlas (a set of three dimensional points or voxels assigning voxels identity in a standard coordinate space to various parcellations) to the brain after warping it into a standard coordinate space, such as the Montreal Neurologic Institute (MNI) space. Pure anatomic-based techniques of atlasing can fail when applied to patients with structurally abnormal brains, such as those with brain tumors, stroke, hydrocephalus, traumatic brain injury and atrophy. For these and other reasons, there is a need to be able to map functional areas in individuals, e.g., in individuals with varying brains, in a way that addresses these issues, as it would make a number of valuable analytics possible to improve outcomes.

Disclosed are arrangements, referred to as Parcellation Adjustment (PAA) arrangements, which seek to address the above problems as described in the following paragraphs.

A first aspect of the present invention provides a method of processing a set of Digital Imaging and Communications in Medicine (DICOM) images of a particular brain to be parcellated. DICOM is an international standard for transmitting, storing, retrieving, processing and/or displaying medical imaging information. The method includes the steps of: determining a registration function for the particular brain in a Montreal Neurological Institute (MNI) space (a common coordinate space) described by a set of standard brain data image sets; determining a registered atlas from a human connectome project—multi-modal parcellation atlas (i.e., a HCP-MMP1 Atlas) containing a standard parcellation scheme and the registration function; performing diffusion tractography of the DICOM images to determine a set of whole brain tractography images of the particular brain (in neuroscience, tractography can be thought of as a 3D modelling technique used to represent white matter tracts visually); for each voxel in a particular parcellation in the registered atlas: determining voxel level tractography vectors showing connectivity of the voxel with voxels in other parcellations; classifying the voxel based on the probability of the voxel being part of the particular parcellation; and repeating the determining of the voxel level tractography vectors and the classifying of the voxels for all parcellations of the HCP-MMP1 Atlas to form a personalised brain atlas (PBs Atlas) containing an adjusted parcellation scheme reflecting the particular brain.

The method above can optionally be combined with any one of, or any combination of, the features set out in the following.

Optionally, in the method of paragraph above, the method further includes, prior to the repeating step, the step of interpolating the voxel grid for end-to-end parcellated voxel level tractography vectors (Vgridpt) to fill gaps between voxels.

Optionally, in the method above, the method further includes, for each voxel in a particular parcellation in the registered atlas: determining (1120) end-to-end voxel level tractography vectors [1108, Vje] and pass-through parcellated voxel level tractography vectors [1123, Vjn] respectively showing end-to-end and pass-through connectivity of the voxel with voxels in other parcellations; classifying (1124) the voxel to determine labels (1006; LBjejn) and a voxel grid (Vgridptpn) for end-to-end parcellated voxel level tractography vectors and pass-through parcellated voxel level tractography vectors, based on the probability of the voxel being part of the particular parcellation; and interpolating the voxel grid (Vgridptpn) for end-to-end parcellated voxel level tractography vectors and pass-through parcellated voxel level tractography vectors to fill gaps between voxels. For a tract going from A to C and passing through B, the tract is an "end-to-end" tract from the perspective of A or C and it is a "pass-through" tract from the perspective of B.

Optionally, in the method above, the step of determining the registration function for the particular brain in the MNI space includes the steps of: performing face stripping, skull stripping and masking of a Neuroimaging Informatics Technology Initiative (NIfTI) version of the T1 images of the DICOM image set to obtain a masked, skull and face stripped T1 image; and determining a relationship between the masked, skull and face stripped T1 image and the set of standard brain data image sets to generate the registration function. As noted face stripping is optional; skull stripping can achieve face stripping as a side effect.

Optionally, in the method above, the step of determining the registered atlas includes applying the registration function to the HCP-MMP1 Atlas to generate the registered atlas.

Optionally, in the method above, the step of performing diffusion tractography of the DICOM images is performed in relation to a skull stripped and face stripped masked NIfTI version of DTI images of the DICOM image set.

Optionally, in the method above, the determining of the voxel level tractography vectors includes the steps of: registering the registered Atlas and the Whole brain tractography image set; generating end-to-end parcellated voxel level tractography vectors; and generating end-to-end and pass-through parcellated voxel level tractography vectors.

Optionally, in the method above, the step of classifying the voxel comprises processing the end-to-end parcellated voxel level tractography vectors and the pass-through parcellated voxel level tractography vectors with an end-to-end classifier and a pass-by classifier to classify voxels into parcellations and/or to form a voxel grid.

According to another aspect of the present invention, there is provided an apparatus for implementing any one of the aforementioned methods.

According to another aspect of the present invention, there is provided a computer program product including a computer readable medium having recorded thereon a computer program for implementing any one of the methods described above.

Other aspects are also disclosed.

BRIEF DESCRIPTION OF THE DRAWINGS

At least one embodiment of the present invention will now be described with reference to the drawings in which:

FIGS. 10A and 10B depict voxel level tractography vectors showing connectivity of voxels;

FIG. 10C depicts a relationship between parcellations, voxel parcellation identities and voxel level tractography vectors;

DETAILED DESCRIPTION

Figure 1:
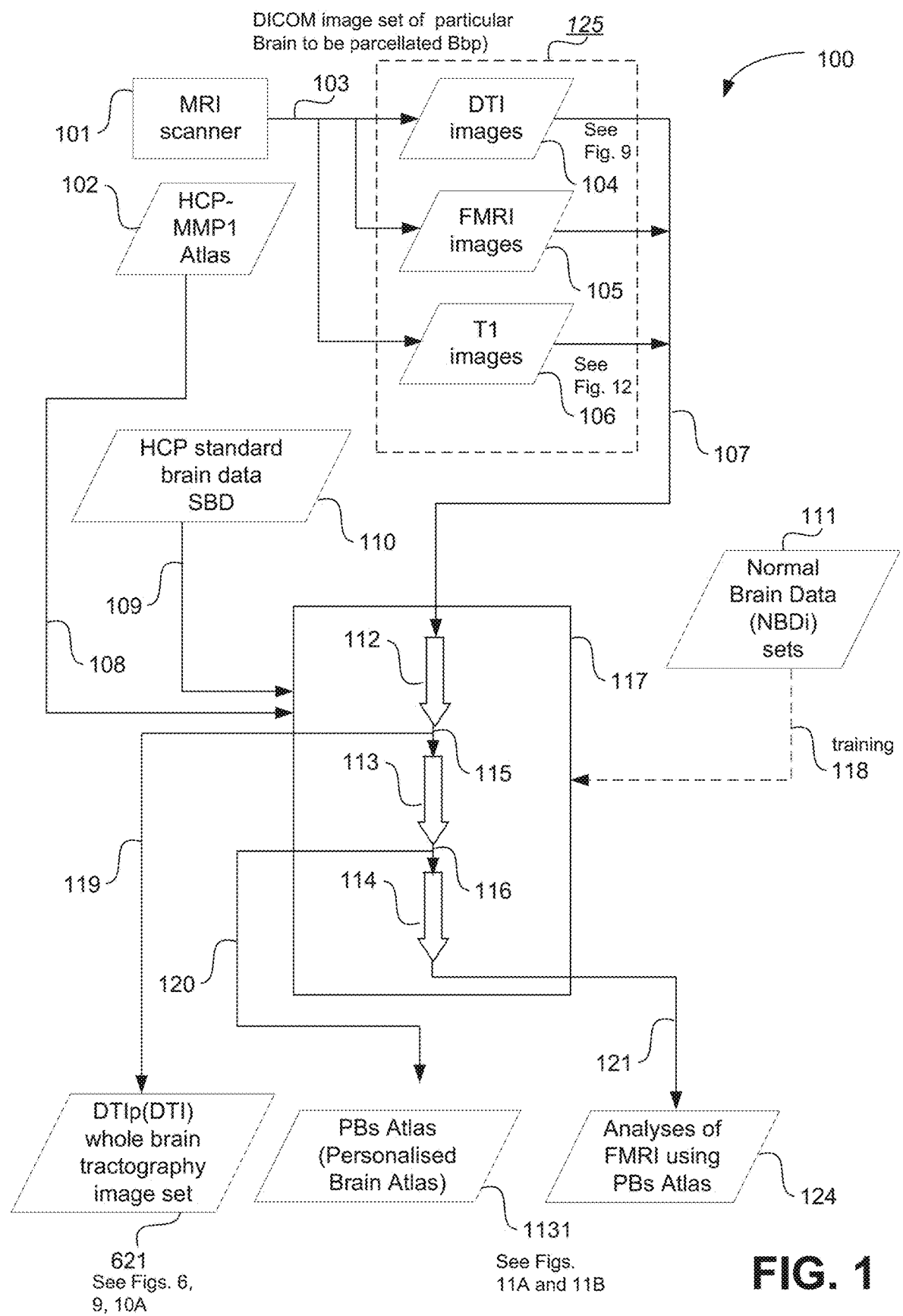
FIG. 1 shows a functional block and data flow diagram of an example of a PAA arrangement.

Where reference is made in any one or more of the accompanying drawings to steps and/or features, which have the same reference numerals, those steps and/or features have for the purposes of this description the same function(s) or operation(s), unless the contrary intention appears.

| No. | Term | Description | Format/comment |
|---|---|---|---|
| 1 | $AM_i$ | Voxel level adjacency matrix for brain in ith NBD set | Each voxel gets a set of vectors. $AM_i$ contains both features, vectors and labels for each voxel |
| 2 | Analyses | | |
| 3 | Ard (T1) | Registered Atlas warped to Niiwfs(T1) | 3D single image |
| 4 | $Ard_i$(T1) | Ard associated with ith NBD set | 3D single image |
| 5 | Bbp | Particular brain being parcellated (ie the brain from which the DICOM image set 125 has been generated) | |
| 6 | Bval(DTI) | Diffusion tensor value (magnitude) of DTI | Typically contained in DICOM set; where this is not the case, default values are used. |
| 7 | Bvec(DTI) | Diffusion tensor gradient (direction) of DTI | Typically contained in DICOM set; where this is not the case, default values are used. |
| 8 | DICOM images | Digital Imaging and Communications standard naïve images for processing | Compressed JPEG file having a header including a file format definition and other information for all the DICOM images, and a network communications protocol-encompasses DTI, FMRI and T1 (equivalent to raw data collected by a helicopter camera flying over a city) |
| 9 | $DR_i$ | Registered data | Between $Ard_i$(T1) and $DTIp_i$(DTI) |
| 10 | DTI images | Diffusion Tensor Image set-show connections between areas of the brain | 4D set of images, ie set plurality of slices each comprising a 3-dimensional (3D) image |
| 11 | DTIp(DTI) | Whole brain tractography image set | Can be used by a surgeon for broad brush surgical planning (equivalent to description of all the roads in the city-derived from the raw helicopter data) |
| 12 | $DTIp_i$(DTI) | tractography image set for brain in ith NBD set | Array of tractography vectors (also referred to as tracts) |
| 13 | DWi(DTI) | NIfTI of DTI | 4D image set |
| 14 | DWiall(DTI) | DWim(DTI) loosely aligned with Nii(T1) | 3D single image |
| 15 | DWialt(DTI) | DWim(DTI) tightly aligned with Nii(T1) | 3D single image |
| 16 | DWiav(DTI) | Average of DWi(DTI) | 3D single image |

GLOSSARY OF TERMS

| No. | Term | Description | Format/comment |
|---|---|---|---|
| 17 | DWiavb(DTI) | Binary mask of DWiav(DTI) | Produce 3D single image using, for example, Median Otsu algorithm |
| 18 | DWiavbbr (DTI) | Brain part of DWiavbbr(DTI) | 3D single image |
| 19 | DWiavbbrnh (DTI) | DWiavbbr(DTI) without holes | 3D single image |
| 20 | DWim(DTI) | DWi(DTI) masked with DWiavbbrnh(DTI) | 3D single image |
| 21 | DWimpl(DTI) | Loosely mapped DWi(DTI) | 3D single image |
| 22 | DWimpt(DTI) | Tightly mapped DWi(DTI) | 3D single image |
| 23 | DWiwf(DTI) | DWi(DTI) without face | 3D single image |
| 24 | DWiwflm(DTI) | Loosely masked DWi(DTI) | 3D single image |
| 25 | DWiwfs(DTI) | Masked DWi(DTI) with face and skull removed | 3D single image |
| 26 | DWiwftm(DTI) | Tightly masked DWi(DTI) | 3D single image |
| 27 | Fal | Loose alignment function | Function that allows a 3D single image to be aligned onto another with a loose fit. |
| 28 | Fat | Tight alignment function | Function that allows a 3D single image to be aligned onto another with a tight fit. |
| 29 | FMRI images | Functional Magnetic Resonance Image set-show activity in areas of the brain | 4D set of images, ie set plurality of slices each comprising a 3D image (equivalent to the number of cars travelling on each road-derived from the helicopter raw data) |
| 30 | HCP-MMP1 Atlas | HCP-MMP1 Atlas | (equivalent to a generic set of roads-similar to the DTIp(DTI)) gets warped onto the SBD to introduce coordinates (of parcels) onto the SBD data. Stated differently, HCP-MMP can be thought of as an overlay of country borders that one can warp onto a spherical globe. The DTI can then be thought of as showing the roads between the different countries drawn by the warped HCP. |
| 31 | HCP SBD | Human Connectome Project (HCP) Standard Brain Data (also referred to as the Montreal Neurological Institute or MNI Brain Data) | 4D set of images-Average brain data from a number of brains-no one actually has this brain configuration |
| 32 | LBje | Labels associated with tractography vectors Vje | |
| 33 | LBjejn | Labels associated with tractography vectors Vje and Vjn | |
| 34 | MI(T1) | Loose mask for Nii(T1) | 3D single binary image used to filter another image |
| 35 | MODpn | Pass-through parcellation classifier | Input is vector-output is parcel-also considers parcels to which vector comes near (referred to as pass through vectors) |
| 36 | MODpt | End-to-end parcellation classifier | Input is vector-output is parcel-considers only end to end termination parcels |
| 37 | MRI | Magnetic Resonance Imaging | This is a method by which the brain imaging data is acquired |
| 38 | Mt(T1) | Tight mask for Nii(T1) | 3D single binary image used to filter another image |
| 39 | NBDi | ith Normal brain data set | A set of p normal brain datasets, (iep) used for training-these are actual real brain data sets-distinct from the HCP SBD |
| 40 | NIfTI | Neuroimaging Informatics Technology Initiative | Clinical imaging data are typically stored and transferred in the DICOM format, whereas the NIfTI format has been widely adopted by scientists in the neuroimaging community |
| 41 | Niilm (T1) | Loosely masked Nii(T1) | 3D single image |
| 42 | Niirf(T1) | Registration function | Function that allows the transformation from one 3D single set to another |
| 43 | Nii(T1) | NIfTI of T1 | 3D image set |
| 44 | Niitm(T1) | Tightly masked Nii(T1) | 3D single image |
| 45 | Niiwf(T1) | Nii(T1) with face removed | 4D image set |
| 46 | Niiwfs(T1) | Masked Nii(T1) with face and skull removed | 3D single image |
| 47 | Parcellation adjustment | Adjusting the standard parcellation scheme, for example, of the HCP-MMP1 Atlas, to reflect the actual parcellation of the Bbp | |
| 48 | PBs Atlas | Personalised brain atlas to be applied to a T1 image of the particular brain to be parcellated Bbp | Can be used by a surgeon for more detailed surgical planning on the particular brain to be parcellated Bbp (equivalent to the boundaries of the suburbs-derived from the raw helicopter data) |
| 49 | T1 images | T1 weighted image set-show anatomical details of the brain | 3D set of images |
| 50 | Vgridpt | Voxel grid (for end-to-end parcelled voxel level tractography vectors) generated by processing Vje with MODpt | |
| 51 | Vgridptpn | Voxel grid (for end-to-end parcelled voxel level tractography vectors and pass-through parcelled voxel level tractography vectors) generated by processing Vje, Vjn with MODpt and MODpn | |
| 52 | $Vim_i$ | Voxel level parcellation to tractography vector image set for brain in ith NBD set | Provides labels, vectors and features for each voxel |

-continued

GLOSSARY OF TERMS

| No. | Term | Description | Format/comment |
|---|---|---|---|
| 53 | Vje | End-to-end parcellated voxel level tractography vectors generated using HCP-MMP1 Atlas | Array of vectors stored in memory |
| 54 | Vjn | Pass-through parcellated voxel level tractography vectors generated using HCP-MMP1 Atlas | Array of vectors stored in memory |
| 55 | DWiwfswr (DTI) | Masked DWi(DTI) with face, skull and free water removed | |
| 56 | DWiwmt(DTI) | DWiwfswr(DTI) with white matter tracts | |

FIG. 1 shows a functional block and data flow diagram of an example 100 of the PAA arrangement for processing a set of DICOM images. An MRI scanner 101 produces, as depicted by an arrow 103, a DICOM image set 125 of a brain to be parcellated Bbp. The DICOM image set 125 comprises a 4 dimensional (referred to hereinafter as 4D) set 104 of DTI images of the Bbp (described hereinafter in more detail with reference to FIG. 9), a 4D set 105 of fMRI images of the Bbp, and a 3D set 106 of T1 images of the Bbp (described hereinafter in more detail with reference to FIG. 12. See the GLOSSARY OF TERMS for more details of these image sets). These sets of images are provided, as depicted by an arrow 107, to a PAA processing module 117, described hereinafter in more detail with reference to FIGS. 2A, 2B, 3, 4, 5A, 5B, 5C, 6, 7, 8A, 8B, 10A, 10B, 10C, 11A and 11B.

The PAA processing module 117 also receives, as depicted by an arrow 109, a 4D set of HCP Standard Brain Data (HCP SDB) (ie 110). The PAA processing module 117 also receives, as depicted by an arrow 108, a 3D HCP-MMP1 Atlas 102 containing a standard parcellation scheme. The PAA processing module 117 also receives, as depicted by a dashed arrow 118, a collection 111 of "p" sets of Normal Brain Data (NBDi) where 1<i<p. The dashed arrow 118 indicates that the NBD sets 111 are used by the PAA module 117 for training, described hereinafter in more detail with reference to FIGS. 8A and 8B.

The PAA processing module 117 can, in one example, be implemented as three pipeline segments 112, 113 and 114. The pipeline segment 112 outputs, as depicted by an arrow 119, a 4D whole brain tractography image set DTIp(DTI) having a reference numeral 621 (described hereinafter in more detail with reference to FIGS. 6, 9 and 10A). The pipeline segment 113 outputs, as depicted by an arrow 120, a 3D personalised Brain Atlas (PBs Atlas) having reference numeral 1131 (described hereinafter in more detail with reference to FIGS. 11A and 11B). The pipeline segment 114 outputs, as depicted by an arrow 121, analyses of the fMRI images 105 which are generated based upon the personalised brain atlas PBs Atlas (ie 1131). The disclosed PAA arrangements and, in particular, the personalised PBs Atlas provide more precise parcellation information for the particular brain in question than currently available, with correspondingly much greater clinical usefulness. Using the warped HCP as ground truth, the model can achieve better than 96% precision and recall. The model also stands the scrutiny of experts with no abnormalities found to date (e.g., no parcellation found in cavities or in necrotic tissue).

Figure 2A:
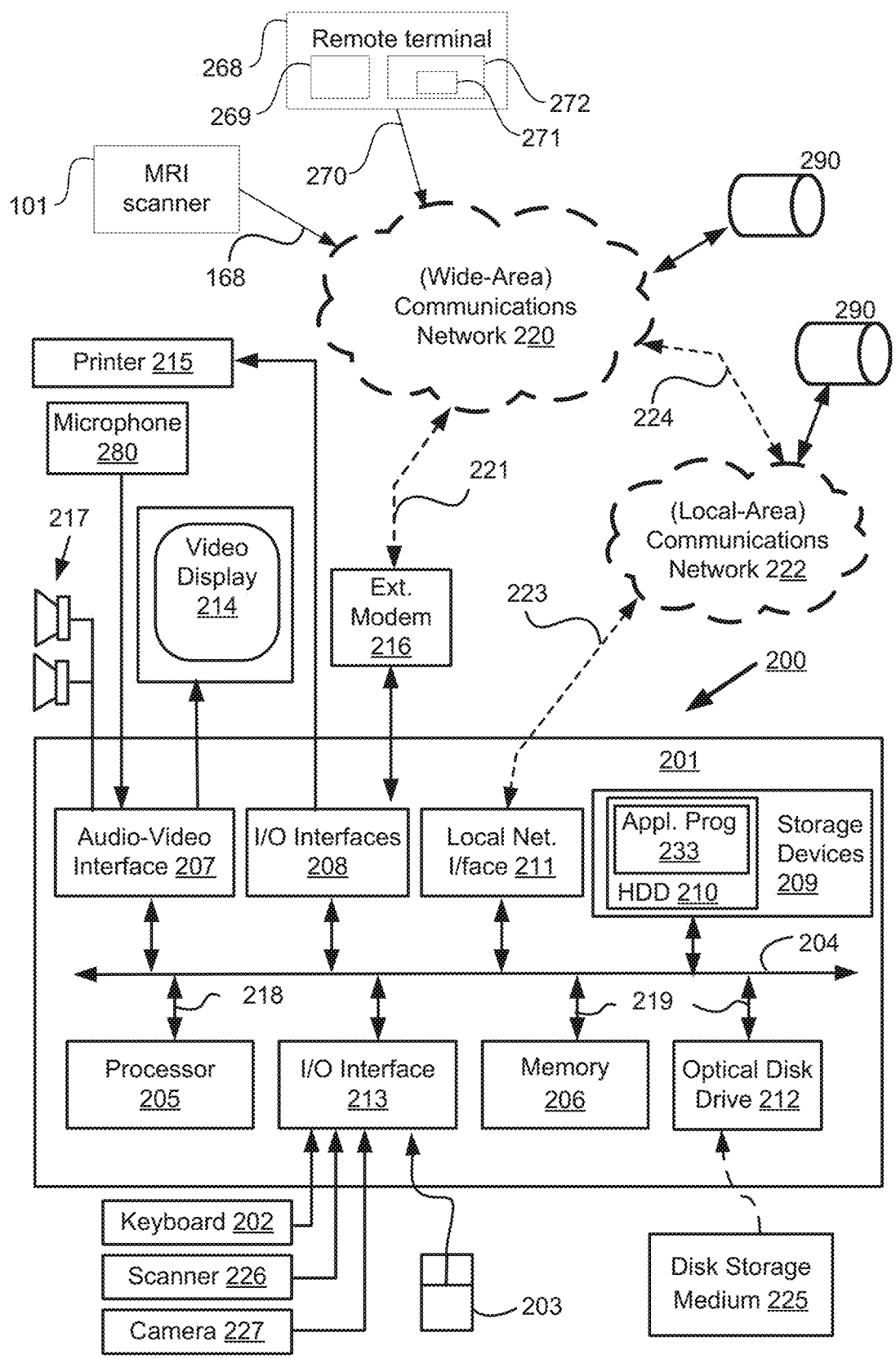
FIGS. 2A and 2B form a schematic block diagram of a computer system upon which described PAA arrangements can be practiced.
Figure 2B:
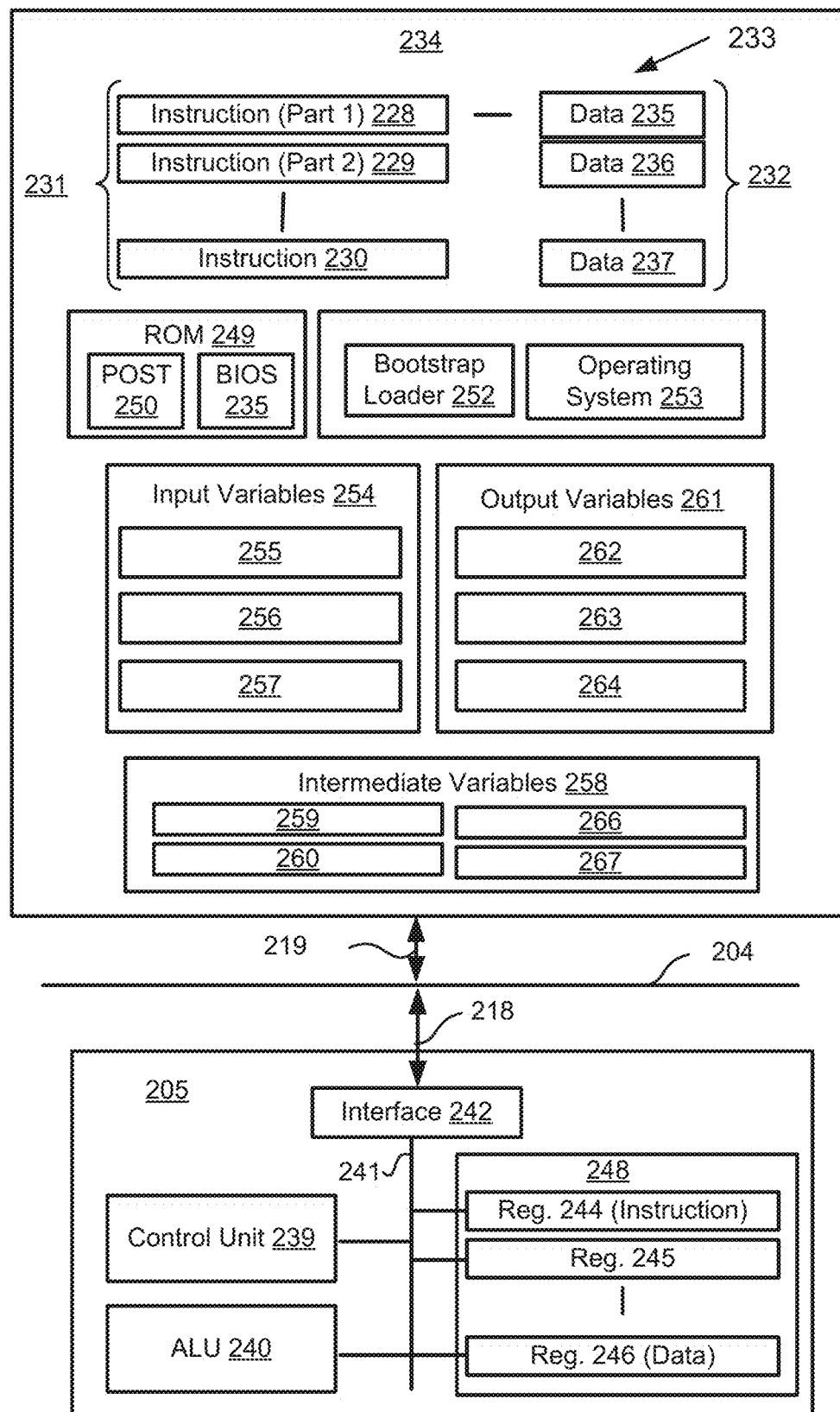

FIGS. 2A and 2B form a schematic block diagram of a computer system upon which described PAA arrangements can be practiced. The following description is directed primarily to a computer server module 201. However, the description applies equally or equivalently to one or more remote terminals 268.

As seen in FIG. 2A, the computer system 200 includes: the server computer module 201; input devices such as a keyboard 202, a mouse pointer device 203, a scanner 226, a camera 227, and a microphone 280; and output devices including a printer 215, a display device 214 and loudspeakers 217. An external Modulator-Demodulator (Modem) transceiver device 216 may be used by the computer server module 201 for communicating to and from the remote terminal 268 over a computer communications network 220 via a connection 221 and a connection 270. The aforementioned communication may be considered to be taking place between the remote terminal 268 and "the cloud" which in the present description comprises at least the one server module 201. The remote terminal 268 typically has input and output devices (not shown) which are similar to those described in regard to the server module 201. The communications network 220 may be a wide-area network (WAN), such as the Internet, a cellular telecommunications network, or a private WAN. Where the connection 221 is a telephone line, the modem 216 may be a traditional "dial-up" modem. Alternatively, where the connection 221 is a high capacity (e.g., cable) connection, the modem 216 may be a broadband modem. A wireless modem may also be used for wireless connection to the communications network 220.

The computer server module 201 typically includes at least one processor unit 205, and a memory unit 206. For example, the memory unit 206 may have semiconductor random access memory (RAM) and semiconductor read only memory (ROM). The remote terminal 268 typically includes as least one processor 269 and a memory 272. The computer server module 201 also includes a number of input/output (I/O) interfaces including: an audio-video interface 207 that couples to the video display 214, loudspeakers 217 and microphone 280; an I/O interface 213 that couples to the keyboard 202, mouse 203, scanner 226, camera 227 and optionally a joystick or other human interface device (not illustrated); and an interface 208 for the external modem 216 and printer 215. In some implementations, the modem 216 may be incorporated within the computer module 201, for example within the interface 208. The computer module 201 also has a local network interface 211, which permits coupling of the computer system 200 via a connection 223 to a local-area communications network 222, known as a Local Area Network (LAN). As illustrated in FIG. 2A, the local communications network 222 may also couple to the wide network 220 via a connection 224, which would typically include a so-called "firewall" device or device of similar functionality. The local network interface 211 may comprise an Ethernet circuit card, a Bluetooth® wireless arrangement or an IEEE 802.11 wireless arrangement; however, numerous other types of interfaces may be practiced for the interface 211.

The I/O interfaces 208 and 213 may afford either or both of serial and parallel connectivity, the former typically being implemented according to the Universal Serial Bus (USB) standards and having corresponding USB connectors (not illustrated). Storage memory devices 209 are provided and typically include a hard disk drive (HDD) 210. Other storage devices such as a floppy disk drive and a magnetic tape drive (not illustrated) may also be used. An optical disk drive 212 is typically provided to act as a non-volatile source of data. Portable memory devices, such optical disks (e.g., CD-ROM, DVD, Blu-ray Disc™), USB-RAM, portable, external hard drives, and floppy disks, for example, may be used as appropriate sources of data to the system 200.

The components 205 to 213 of the computer module 201 typically communicate via an interconnected bus 204 and in a manner that results in a conventional mode of operation of the computer system 200 known to those in the relevant art. For example, the processor 205 is coupled to the system bus 204 using a connection 218. Likewise, the memory 206 and optical disk drive 212 are coupled to the system bus 204 by connections 219. Examples of computers on which the described arrangements can be practised include IBM-PC's and compatibles, Sun Sparcstations, Apple Mac™ or like computer systems.

The PAA method may be implemented using the computer system 200 wherein the processes of FIGS. 1, 3, 4, 5A, 5B, 5C, 6, 7, 8A, 8B, 11A and 11B, to be described, may be implemented as one or more software application programs 233 executable within the computer system 200. In one PAA arrangement, the one or more software application programs 233 execute on the computer server module 201 (the remote terminal 268 may also perform processing jointly with the computer server module 201), and a browser 271 executes on the processor 269 in the remote terminal, thereby enabling a user of the remote terminal 268 to access the software application programs 233 executing on the server 201 (which is often referred to as "the cloud") using the browser 271. In one PAA arrangement the processes of FIGS. 1, 3, 4, 5A, 5B, 5C, 6, 7, 8A, 8B, 11A and 11B are performed using PYTHON or equivalent language modules which have been installed on one or both of the server module 201 and the remote terminal 268. In particular, the steps of the PAA method are effected by instructions 231 (see FIG. 2B) in the software 233 that are carried out within the computer system 200. The software instructions 231 may be formed as one or more code modules, each for performing one or more particular tasks. The software may also be divided into two separate parts, in which a first part and the corresponding code modules performs the PAA methods and a second part and the corresponding code modules manage a user interface between the first part and the user.

The software may be stored in a computer readable medium, including the storage devices described below, for example. The software is loaded into the computer system 200 from the computer readable medium, and then executed by the computer system 200. A computer readable medium having such software or computer program recorded on the computer readable medium is a computer program product. The use of the computer program product in the computer system 200 preferably effects an advantageous PAA apparatus. The PAA software may also be distributed using a Web browser.

The software 233 is typically stored in the HDD 210 or the memory 206 (and possibly at least to some extent in the memory 272 of the remote terminal 268). The software is loaded into the computer system 200 from a computer readable medium, and executed by the computer system 200. Thus, for example, the software 233 (comprising one or more programs) may be stored on an optically readable disk storage medium (e.g., CD-ROM) 225 that is read by the optical disk drive 212. A computer readable medium having such software or computer program recorded on it is a computer program product. The use of the computer program product in the computer system 200 preferably effects a PAA apparatus.

In some instances, the application programs 233 may be supplied to the user encoded on one or more CD-ROMs 225 and read via the corresponding drive 212, or alternatively may be read by the user from the networks 220 or 222. Still further, the software can also be loaded into the computer system 200 from other computer readable media. Computer readable storage media refers to any non-transitory tangible storage medium that provides recorded instructions and/or data to the computer system 200 for execution and/or processing. Examples of such storage media include floppy disks, magnetic tape, CD-ROM, DVD, Blu-ray™ Disc, a hard disk drive, a ROM or integrated circuit, USB memory, a magneto-optical disk, or a computer readable card such as a PCMCIA card and the like, whether or not such devices are internal or external of the computer module 201. Examples of transitory or non-tangible computer readable transmission media that may also participate in the provision of software, application programs, instructions and/or data to the computer module 201 include radio or infra-red transmission channels as well as a network connection to another computer or networked device, and the Internet or Intranets including e-mail transmissions and information recorded on Websites and the like.

The second part of the application programs 233 and the corresponding code modules mentioned above may be executed to implement one or more graphical user interfaces (GUIs) to be rendered or otherwise represented upon the display 214. Through manipulation of typically the keyboard 202 and the mouse 203, a user of the computer system 200 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 217 and user voice commands input via the microphone 280.

FIG. 2B is a detailed schematic block diagram of the processor 205 and a "memory" 234. The memory 234 represents a logical aggregation of all the memory modules (including the HDD 209 and semiconductor memory 206) that can be accessed by the computer module 201 in FIG. 2A.

When the computer module 201 is initially powered up, a power-on self-test (POST) program 250 executes. The POST program 250 is typically stored in a ROM 249 of the semiconductor memory 206 of FIG. 2A. A hardware device such as the ROM 249 storing software is sometimes referred to as firmware. The POST program 250 examines hardware within the computer module 201 to ensure proper functioning and typically checks the processor 205, the memory 234 (209, 206), and a basic input-output systems software (BIOS) module 251, also typically stored in the ROM 249, for correct operation. Once the POST program 250 has run successfully, the BIOS 251 activates the hard disk drive 210 of FIG. 2A. Activation of the hard disk drive 210 causes a bootstrap loader program 252 that is resident on the hard disk drive 210 to execute via the processor 205. This loads an operating system 253 into the RAM memory 206, upon which the operating system 253 commences operation. The operating system 253 is a system level application, executable by the processor 205, to fulfil various high-level functions, including processor management, memory management, device management, storage management, software application interface, and generic user interface.

The operating system 253 manages the memory 234 (209, 206) to ensure that each process or application running on the computer module 201 has sufficient memory in which to execute without colliding with memory allocated to another process. Furthermore, the different types of memory available in the system 200 of FIG. 2A must be used properly so that each process can run effectively. Accordingly, the aggregated memory 234 is not intended to illustrate how particular segments of memory are allocated (unless otherwise stated), but rather to provide a general view of the memory accessible by the computer system 200 and how such is used.

As shown in FIG. 2B, the processor 205 includes a number of functional modules including a control unit 239, an arithmetic logic unit (ALU) 240, and a local or internal memory 248, sometimes called a cache memory. The cache memory 248 typically includes a number of storage registers 244-246 in a register section. One or more internal busses 241 functionally interconnect these functional modules. The processor 205 typically also has one or more interfaces 242 for communicating with external devices via the system bus 204, using a connection 218. The memory 234 is coupled to the bus 204 using a connection 219.

The application program 233 includes a sequence of instructions 231 that may include conditional branch and loop instructions. The program 233 may also include data 232 which is used in execution of the program 233. The instructions 231 and the data 232 are stored in memory locations 228, 229, 230 and 235, 236, 237, respectively. Depending upon the relative size of the instructions 231 and the memory locations 228-230, a particular instruction may be stored in a single memory location as depicted by the instruction shown in the memory location 230. Alternately, an instruction may be segmented into a number of parts each of which is stored in a separate memory location, as depicted by the instruction segments shown in the memory locations 228 and 229.

In general, the processor 205 is given a set of instructions which are executed therein. The processor 205 waits for a subsequent input, to which the processor 205 reacts to by executing another set of instructions. Each input may be provided from one or more of a number of sources, including data generated by one or more of the input devices 202, 203, data received from an external source such as the MRI scanner 101 across one of the networks 220, 202, data retrieved from one of the storage devices 206, 209 or data retrieved from a storage medium 225 inserted into the corresponding reader 212, all depicted in FIG. 2A. The execution of a set of the instructions may in some cases result in output of data. Execution may also involve storing data or variables to the memory 234.

The disclosed PAA arrangements use input variables 254, (for example the DICOM image set 125, the HCP-MMP1 Atlas 102, the HCP standard brain data SDB (ie 110), and the Normal Brain Data (NBD) sets 111) which are stored in the memory 234 in corresponding memory locations 255, 256, 257. The PAA arrangements produce output variables 261, (for example the DTIp whole brain tractography image set 621, the PBs Atlas (personalised brain atlas) 1131, and the analyses of the FMRI images 105 (ie 124)), which are stored in the memory 234 in corresponding memory locations 262, 263, 264. Intermediate variables 258 may be stored in memory locations 259, 260, 266 and 267.

Referring to the processor 205 of FIG. 2B, the registers 244, 245, 246, the arithmetic logic unit (ALU) 240, and the control unit 239 work together to perform sequences of micro-operations needed to perform "fetch, decode, and execute" cycles for every instruction in the instruction set making up the program 233. Each fetch, decode, and execute cycle comprises:

a fetch operation, which fetches or reads an instruction 231 from a memory location 228, 229, 230;
a decode operation in which the control unit 239 determines which instruction has been fetched; and
an execute operation in which the control unit 239 and/or the ALU 240 execute the instruction.

Thereafter, a further fetch, decode, and execute cycle for the next instruction may be executed. Similarly, a store cycle may be performed by which the control unit 239 stores or writes a value to a memory location 232.

Each step or sub-process in the processes of FIGS. 1, 3, 4, 5A, 5B, 5C, 6, 7, 8A, 8B, 11A and 11B is associated with one or more segments of the program 233 and is performed by the register section 244, 245, 247, the ALU 240, and the control unit 239 in the processor 205 working together to perform the fetch, decode, and execute cycles for every instruction in the instruction set for the noted segments of the program 233. Although a cloud-based platform has been described for practicing the disclosed PAA arrangements, other platform configurations can also be used. Furthermore, other hardware/software configurations and distributions can also be used for practicing the disclosed PAA arrangement.

Figure 3:
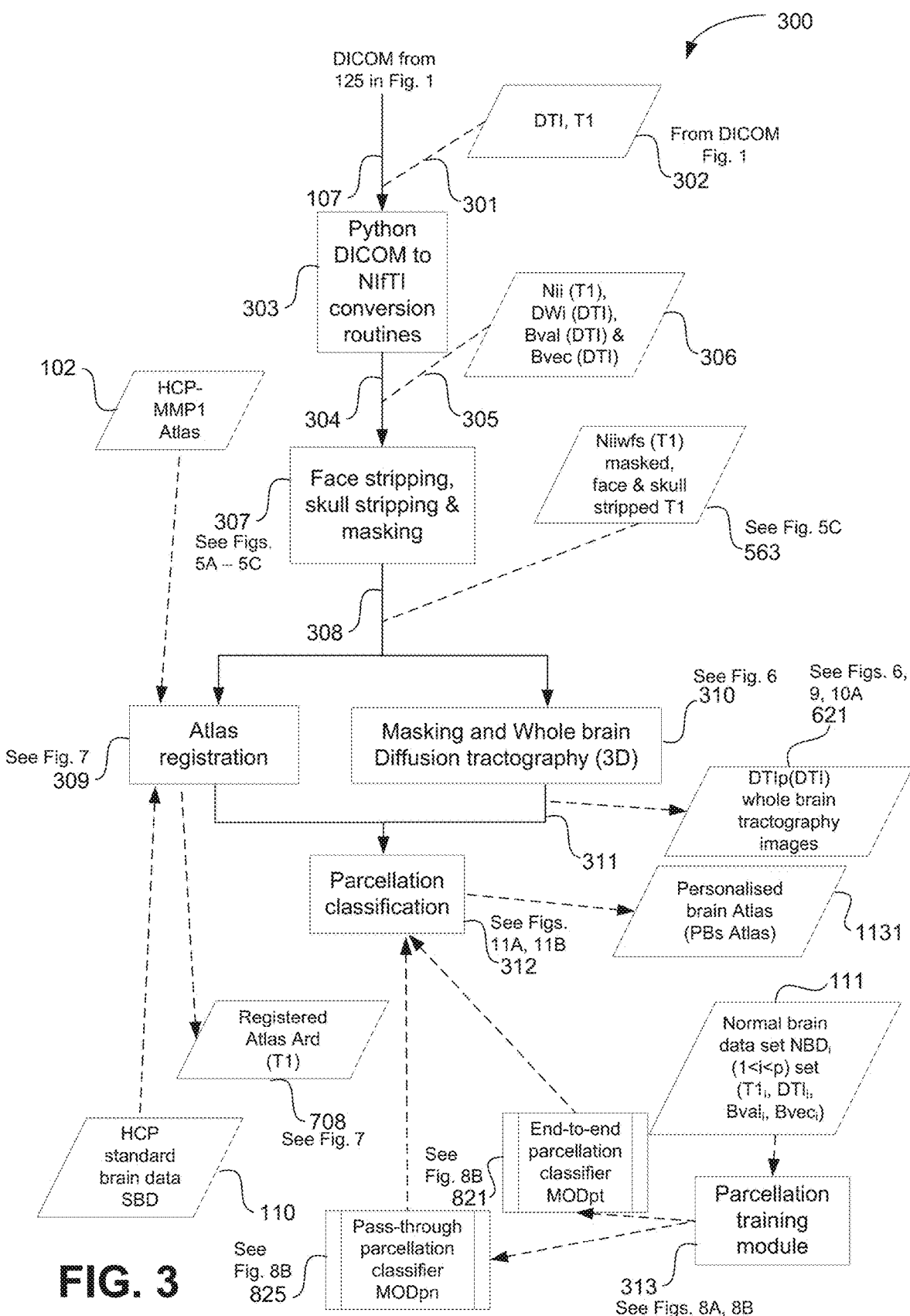
FIG. 3 is a process flow chart example of how the PAA arrangement can be performed.

FIG. 3 is a process flow chart example 300 of how the PAA arrangement can be performed using PYTHON or equivalent language and library routines. With reference to FIGS. 2 and 3, a step 303, performed by the processor 205 executing the PAA software program 233, receives the DICOM data set 125, as depicted by the arrow 107. The step 303 processes the DTI images 104 (the Diffusion Tensor Image set) and the T1 images 106 (the T1 weighted image set—see 302) using, for example, Python DICOM to NIfTI conversion routines (NIfTI is the Neuroimaging Informatics Technology Initiative). The step 303 outputs (see 306) a 3D image set Nii(T1) which is a NIfTI version of T1, a 4D image set DWi(DTI) which is a NIfTI version of DTI, a diffusion tensor value Bval(DTI) which is a Diffusion tensor value (magnitude) of DTI, and a diffusion tensor gradient Bvec(DTI) which is a Diffusion tensor gradient (direction) of DTI. The PAA arrangement may use default values for Bval(DTI) and Bvec(DTI) if these are not incorporated in the DICOM data 125.

A following step 307, performed by the processor 205 executing the PAA software program 233 and described hereinafter in more detail with references to FIGS. 5A-5C, performs masking, face stripping and skull stripping (described hereinafter in more detail with reference to FIG. 12) to output a single 3D image Niiwfs(T1) (which is a Masked Nii(T1) with face and skull removed—see 563). Accordingly, the step 307 performs face stripping, skull stripping and masking of a NIfTI version of the T1 images of the DICOM image set to obtain a masked, skull and face stripped T1 image Niiwfs(T1). In masking, a system or method uses one image to derive a mask, that is a 3d set of coordinates that are used on another image for filtering data that should or shouldn't appear at those coordinates.

A following step 309, performed by the processor 205 executing the PAA software program 233 and described hereinafter in more detail with references to FIG. 7, registers image data of the particular brain to be parcellated Bbp onto the HCP-MMP1 Atlas 102 which contains the standard parcellation scheme, using the HCP standard brain data SDB (see 110), to thereby output a 3D single image registered Atlas Ard(T1) (which is the Registered Atlas HCP-MMP1

Atlas 102 warped to Niiwfs(T1)—see 708). The registered Atlas Ard(T1) is described hereinafter in more detail with reference to FIG. 7. Although the steps 309 and 310 are depicted as being in parallel in FIG. 3, these steps need not be performed in parallel. Methods and systems described in this specification can stack rigid and non rigid transformations to achieve the registration. In a rigid transformation, the object is only moved in space to align with the target. In a non-rigid transformation/registration, the object is also warped/deformed to match the target.

A step 310, which is depicted as being performed in parallel with the step 309 in the present PAA example, and which is performed by the processor 205 executing the PAA software program 233 as described hereinafter in more detail with references to FIGS. 6, 9 and 10A, performs masking and whole brain diffusion tractography to output the 3D whole brain tractography image set DTIp(DTI) (see 621). Accordingly, the step 310 performs diffusion tractography of the DICOM images to determine the set DTIp(DTI) of whole brain tractography images of the particular brain.

A following step 312, performed by the processor 205 executing the PAA software program 233 and described hereinafter in more detail with references to FIGS. 11A and 11B, performs parcellation classification, to thereby output a 3D personalised brain atlas (PBs Atlas) (see 1131) according to the PAA arrangement.

In order to perform the parcellation classification the step 312 receives an end-to-end parcellation classifier MODpt (see 821), and a pass-through parcellation classifier MODpn (see 825), described hereinafter in more detail with reference to FIG. 8B. The parcellation classifiers MODpt (which is an end-to-end parcellation classifier—see 821) and MODpn (which is a pass-through parcellation classifier—see 825) are generated by a machine-learning parcellation training process 313, described hereinafter in more detail with reference to FIGS. 8A and 8B. The machine-learning parcellation training process 313 receives, as inputs, Normal brain data sets NBDi, each including associated image sets T1$i$, DTIi, and parameters Bvali, and Bveci where $1<i<p$. Methods and systems described in this specification can use the warped HCP brain to generate first parcellations and then use the coordinates of those parcellations to generate a parcellation to parcellation matrix where the value of each element of the matrix is the normalised number of tracts between the two parcellations specified by the column and row of the matrix and as given by the initial warping. This matrix data is then fed into a classifier along with at least some of the other data noted above for training.

Figure 4:
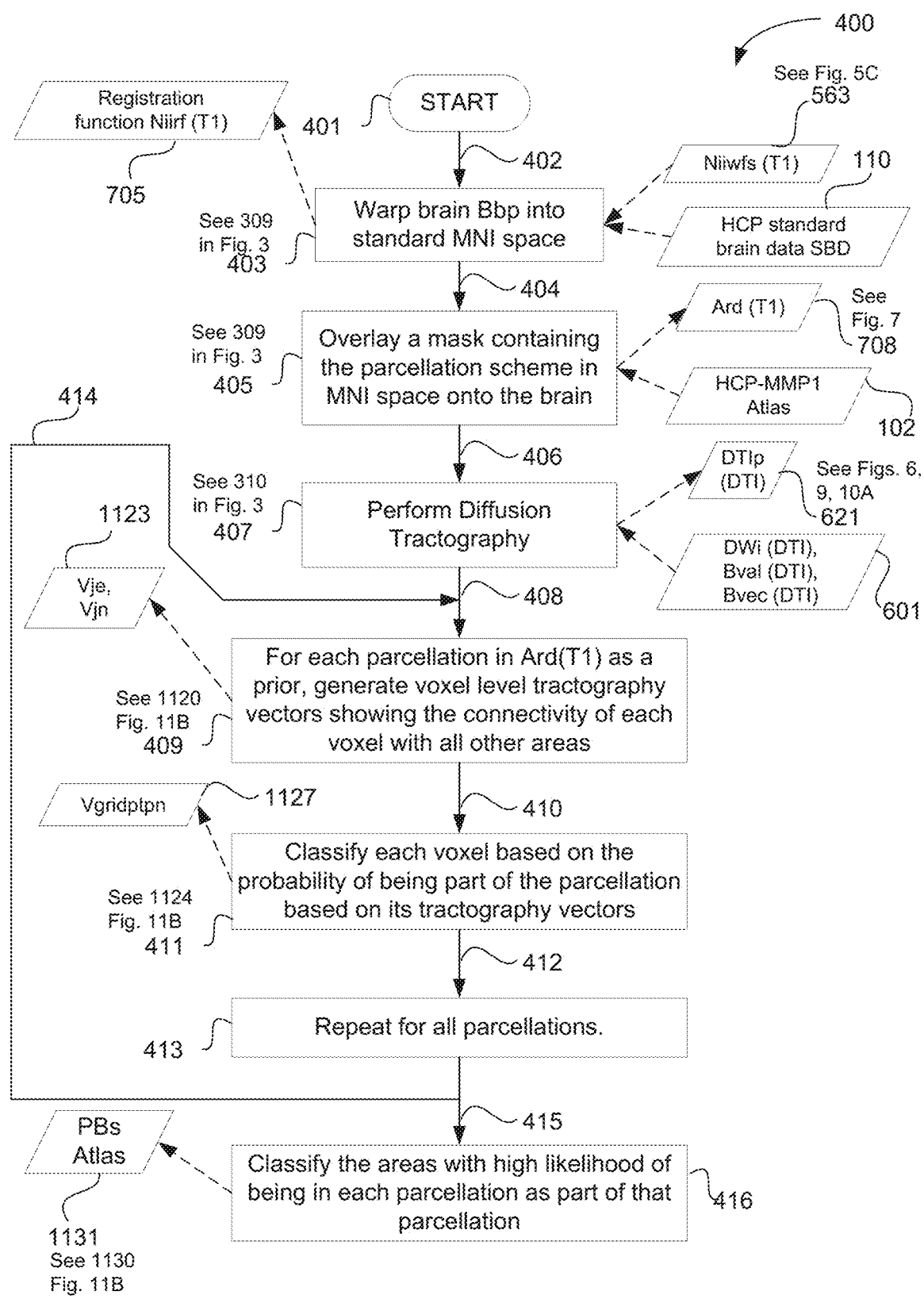
FIG. 4 is a process flow chart example amplifying on details of how the PAA arrangement can be performed.

With reference to FIGS. 2 and 4, FIG. 4 is a process flow chart example 400 amplifying on how the PAA arrangement can be performed. After a start step 401, a step 403, performed by the processor 205 executing the PAA software program 233 and described hereinafter in more detail with reference to FIG. 7, warps the brain Bbp into standard MNI space to thereby output a registration function Niirf(T1) (see 705) which represents the transformation of the DICOM images of the Bbp into 3D standard MNI space. The step 403 receives as inputs the 3D single image Niiwfs(T1) (which is the masked Nii(T1) with face (optionally) and skull removed—see 563) and the HCP standard brain data SBD (ie 110). As noted in 306 in FIG. 3 DWi(DTI) can be used for performing skull stripping to produce Niiwfs(T1).

A following step 405 (see 309 in FIG. 3), performed by the processor 205 executing the PAA software program 233 and described hereinafter in more detail with reference to FIG. 3, overlays a mask containing the standard parcellation scheme of the HCP-MMP1 Atlas (102) in standard MNI space onto the brain Bbp to thereby output the registered atlas Ard(T1) (ie 708) warped to Niiwfs(T1). The step 309 receives as an input the HCP-MMP1 Atlas (see 102).

A following step 407, performed by the processor 205 executing the PAA software program 233 and described hereinafter in more detail with reference to FIGS. 3 and 6, performs diffusion tractography to thereby output the whole brain tractography image set DTIp(DTI) (see 621). The step 407 receives DWi(DTI) ie NIfTI of DTI, Bval(DTI) ie Diffusion tensor value (magnitude) of DTI, and Bvec(DTI) ie Diffusion tensor gradient (direction) of DTI, as inputs (see 601). Constrained spherical deconvolution (CSD) tract generation can be achieved with the DIPY python package (see e.g., https://dipy.org/documentation/0.16.0/examples_built/introduction_to_basic_tracking/).

A following step 409, performed by the processor 205 executing the PAA software program 233 and described hereinafter in more detail with reference to FIG. 11B generates, for each parcellation in Ard(T1) as a prior (eg see 1007 in FIG. 10C for features/parcellations), voxel level tractography vectors (eg see 1008 in FIG. 10C). The voxel level tractography vectors show the connectivity of each voxel with voxels in all other parcellations of the Bbp (the vectors being depicted in FIGS. 9, 10A, 10B and 10C), to thereby output end-to-end vectors Vje (ie End-to-end parcellated voxel level tractography vectors generated using HCP-MMP1 Atlas) and pass-through vectors Vjn (ie Pass-through parcellated voxel level tractography vectors generated using HCP-MMP1 Atlas—see 1123). The End-to-end parcellated voxel level tractography vectors provide an initial approximation of the connectivity, and the Pass-through parcellated voxel level tractography vectors refine the initial approximation to provide a more accurate estimate of the connectivity. The HCP atlas is first warped onto the brain as a prior. The warped atlas is used to generate the feature vector; that is, for a target parcellation, all the other parcellations to which it connects and the normalised number of tracts connecting to it. Thus prior is used above in two ways: 1. Making sure that the machine learning prediction is constrained within one area and 2. Generating the feature vector. Voxels can represent a range of volumes, e.g., anywhere from 0.5 cubic millimeters (mm) to 5 cubic mm or anywhere from 1 cubic mm to 3 cubic mm and parcellations can be made of a varying number of voxels, e.g., anywhere from 2 voxels to 30 voxels or anywhere from 5 to 15 voxels.

A following step 411, performed by the processor 205 executing the PAA software program 233 and described hereinafter in more detail with reference to FIG. 11B, classifies each voxel based upon the probability of that voxel being part of the parcellation based upon its tractography vectors, to thereby output a voxel grid Vgridptpn (ie Voxel grid generated by processing Vje, Vjn with MODpt and MODpn). This process is performed twice, once using MODpt and once using MODpn. Accordingly, the process of determining the voxel grid and predicting the parcellation is performed using two passes. In a first pass, prediction is performed using MODpt. In a second pass, prediction is performed using MODpn. This two-pass process outputs two sets of predictions which may not provide the same prediction (ie the first-pass prediction may conflict with the second-pass prediction). Such conflicts need to be resolved and in one PAA example conflict is resolved as follows: if the first-pass predicts a value A (i.e., the assignment of a voxel to one parcellation), and the second-pass predicts a value B (i.e., the assignment of the same voxel to a different parcellation), then the first pass result is maintained and the second-pass result is discarded. Alternatively, one can use a weighted view between A and B.

A following step 413 directs the process 400 back to the step 409, as depicted by an arrow 414, and the steps 409 and 411 can be repeated for relevant voxels. Accordingly, the step 413 repeats the determining of the end-to-end voxel level tractography vectors and the classifying of the voxels for all parcellations of the HCP-MMP1 Atlas to form a personalised brain Atlas PBs Atlas containing an adjusted parcellation scheme reflecting the particular brain Bbp.

Once all parcellations in the registered atlas Ard(T1) have been processed by the steps 409 and 411 a following step 416, performed by the processor 205 executing the PAA software program 233 and described hereinafter in more detail with reference to FIG. 11B, classifies the voxels with high likelihood of being in each parcellation as part of that parcellation, to thereby output the personalised Brain Atlas (PBs Atlas) (see 1131). The step 416 takes the results of the steps 409 and 411 and resolves any conflicts which may arise as previously described in order to arrive at the final classification.

Figure 5A:
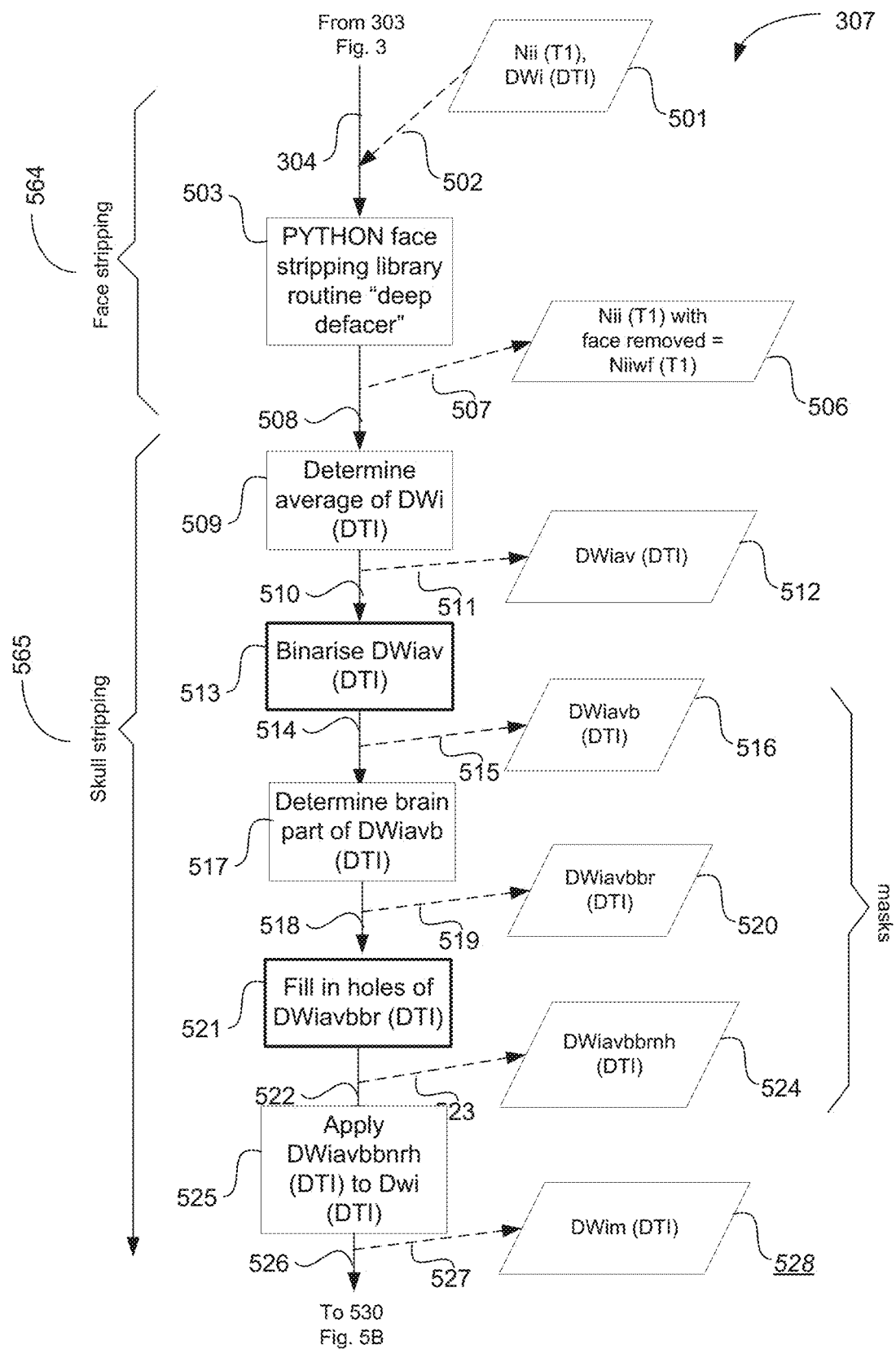
FIGS. 5A, 5B and 5C are process flow chart fragments depicting how the face stripping and skull stripping step 307 of FIG. 3 can be performed.
Figure 5B:
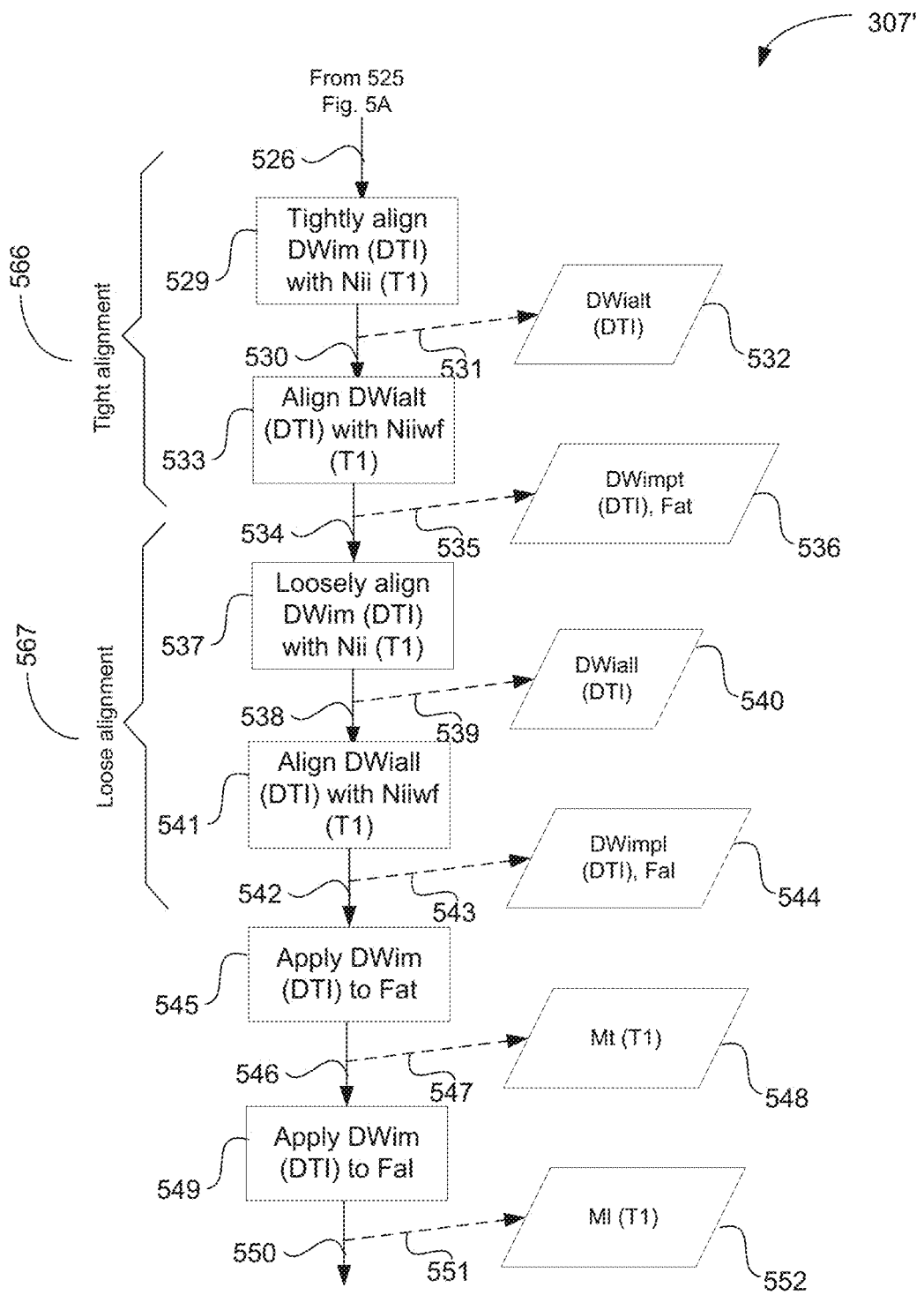
Figure 5C:
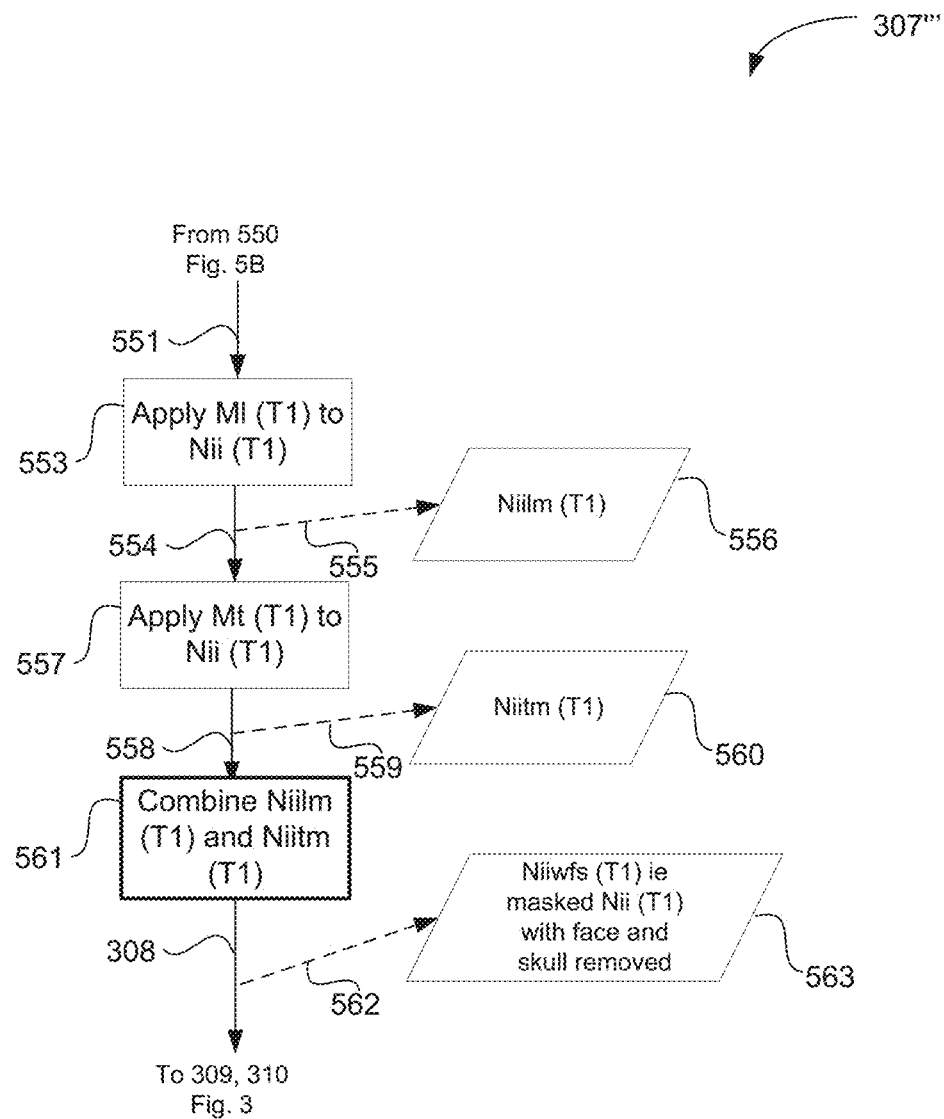

FIGS. 5A, 5B and 5C are process flow chart fragments 307, 307' and 307" depicting how the face stripping and skull stripping step 307 of FIG. 3 can be performed.

In FIG. 5A in the process 307 a step 503, performed by the processor 205 executing the PAA software program 233, receives Nii(T1) and DWi(DTI) (see 501) from 303 in FIG. 3, as depicted by the arrow 304, and removes the face from the Bbp using, for example, the PYTHON face stripping library routine "deep defacer" (see e.g., https://pypt.org/project/deepdefacer/), to thereby output a 3D image set Niiwf(T1) (ie Nii(T1) with face removed—see 506). This is a face stripping phase 564.

A following step 509, performed by the processor 205 executing the PAA software program 233, determines the average of DWi(DTI) to thereby output a 3D image DWiav (DTI) (ie Average of DWi(DTI)—see 512). A following step 513, performed by the processor 205 executing the PAA software program 233, binarises DWiav(DTI) to thereby output a 3D image DWiavb(DTI) (ie Binary mask of DWiav (DTI)—see 516). A following step 517, performed by the processor 205 executing the PAA software program 233, (if necessary) can determine the "brain part" of DWiavb(DTI) to thereby output a 3D image DWiavbbr(DTI) (ie Brain part of DWiavb(DTI)—see 520). A following step 521 (if necessary) is performed by the processor 205 executing the PAA software program 233 and can fill in the holes of DWiavbbr(DTI) to thereby output a 3D image DWiavbbrnh (DTI) ie DWiavbbr(DTI) without holes. A following step 525, performed by the processor 205 executing the PAA software program 233, applies DWiavbbrnh(DTI) to DWi (DTI) to form a 3D image DWim(DTI) (ie DWi(DTI) masked with DWiavbbrnh(DTI)—see 528). This is a skull stripping phase 565. Each frame of the series (collectively 4D data) is processed separately. Each 3D set is first scrutinised for excessive motion, after which the 3D set can be registered and masked.

In FIG. 5B in the process 307' a following step 529, performed by the processor 205 executing the PAA software program 233, tightly aligns DWim(DTI) with Nii(T1) to thereby output a 3D image DWialt(DTI) (ie DWim(DTI) tightly aligned with Nii(T1)—see 532). A following step 533, performed by the processor 205 executing the PAA software program 233, aligns DWialt(DTI) with Niiwf(T1) to thereby output a 3D image DWimpt(DTI) (ie Tightly mapped DWi(DTI)) and a tight alignment function Fat (see 536). This is a tight alignment phase 566.

A following step 537, performed by the processor 205 executing the PAA software program 233, loosely aligns DWim(DTI) with Nii(T1) to thereby output a 3D image DWiall(DTI) (ie DWim(DTI) loosely aligned with Nii (T1)—see 540). A following step 541, performed by the processor 205 executing the PAA software program 233, aligns DWiall(DTI) with Niiwf(T1) to thereby output a 3D image DWimpl(DTI) (ie Loosely mapped DWi(DTI)) and a loose alignment function Fal (see 544). This is a loose alignment phase 567.

A following step 545, performed by the processor 205 executing the PAA software program 233, applies DWim (DTI) to Fat to thereby output a 3D binary image Mt(T1) (ie Tight mask for Nii(T1)—see 548). A following step 549, performed by the processor 205 executing the PAA software program 233, applies DWim(DTI) to Fal to thereby output a 3D binary image Ml(T1) (ie Loose mask for Nii(T1)—see 552).

In FIG. 5C in the process 307" a following step 553, performed by the processor 205 executing the PAA software program 233, applies Ml(T1) to Nii(T1) to thereby output a 3D image Niilm(T1) (ie Loosely masked Nii(T1)—see 556). A following step 557, performed by the processor 205 executing the PAA software program 233, applies Mt(T1) to Nii(T1) to thereby output a 3D image Niitm(T1) (ie Tightly masked Nii(T1)—see 560). A following step 561, performed by the processor 205 executing the PAA software program 233, combines Niilm(T1) and Niitm(T1) to thereby output a 3D image Niiwfs(T1) (ie Masked Nii(T1) with face and skull removed—see 563). In an alternate PAA arrangement, the steps 509-561 may be performed using a single step open source library tool HD-BET (brain extraction tool) which is the result of a joint project between the Department of Neuroradiology at the Heidelberg University Hospital and the Division of Medical Image Computing at the German Cancer Research Center (DKFZ).

Figure 6:
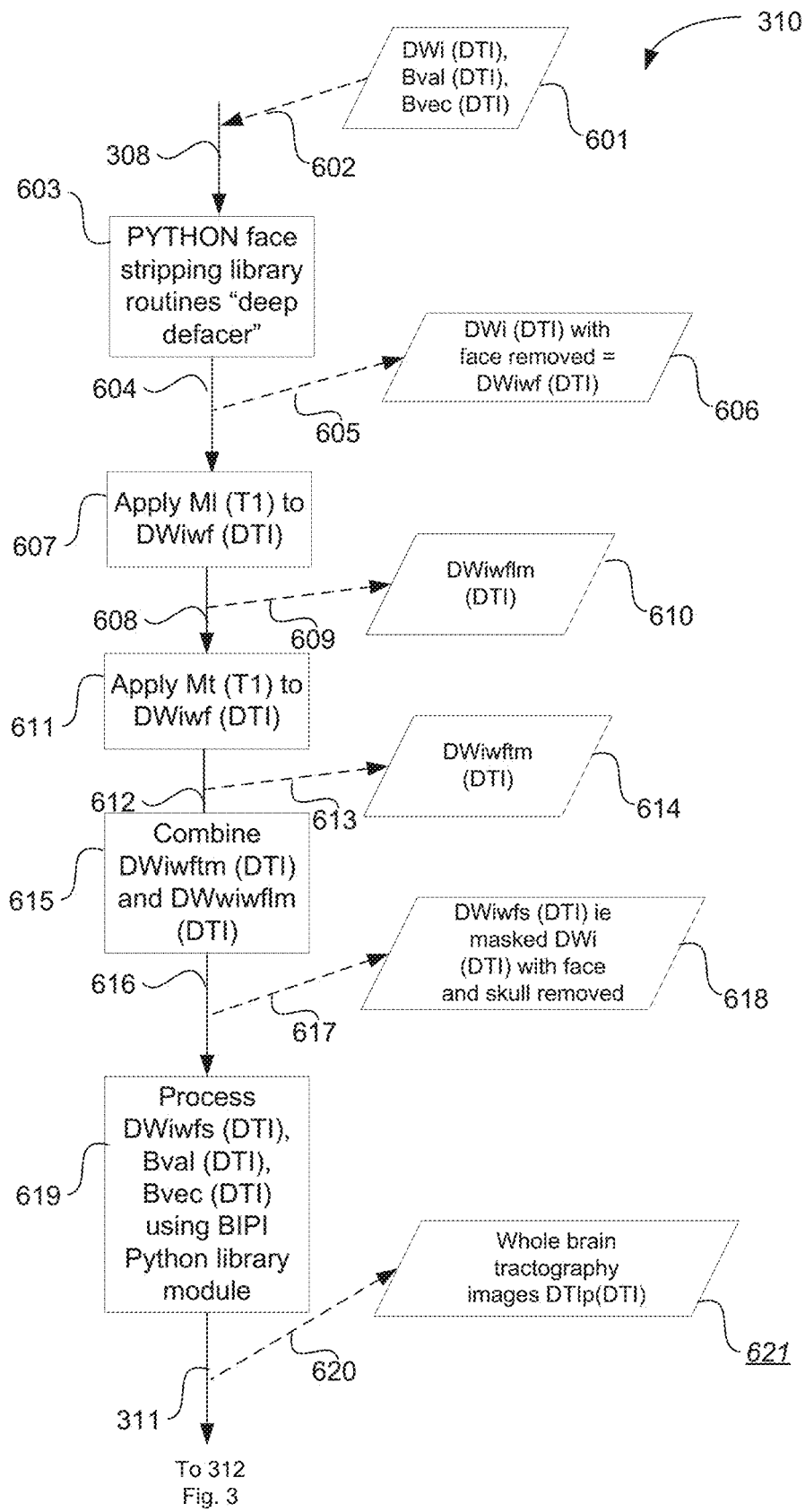
FIG. 6 is a process flow chart example of how the whole brain diffusion tractography step 310 of FIG. 3 can be performed.

FIG. 6 is a process flow chart example of how the whole brain diffusion tractography step 310 of FIG. 3 can be performed. A step 603, performed by the processor 205 executing the PAA software program 233, receives DWi (DTI), Bval(DTI) and Bvec(DTI) as depicted by the arrow 308, and applies, for example, the PYTHON face stripping library routine "deep defacer", to thereby output a 4D image set DWi(DTI) (ie NIfTI of DTI—see 606). A following step 607, performed by the processor 205 executing the PAA software program 233, applies Ml(T1) to DWiwf(DTI), to thereby output a 3D image DWiwflm(DTI) (ie Loosely masked DWi(DTI)—see 610). A following step 611, performed by the processor 205 executing the PAA software program 233, applies Mt(T1) to DWiwf(DTI), to thereby output a 3D image DWiwftm(DTI) (ie Tightly masked DWi(DTI)—see 614). A following step 615, performed by the processor 205 executing the PAA software program 233, combines DWiwftm(DTI) and DWwiwflm(DTI) to thereby output a 3D image DWiwfs(DTI) (ie Masked DWi(DTI) with face and skull removed—see 618). A following step 619, performed by the processor 205 executing the PAA software program 233, processes DWiwfs(DTI), Bval(DTI) and Bvec(DTI) using BIPI Python library module, for example, to thereby output the whole brain tractography image set DTIp(DTI) (see 621). Accordingly, the step 619 of performing diffusion tractography of the DICOM images is performed in relation to a face stripped masked NIfTI version of DTI images of the DICOM image set. Optionally, the step 619 further removes the image component associated with free water from DWi(DTI) before performing tractography (ie parcellation classification) in the step 312.

This is performed by taking as an input a skull stripped DWI Nifti (ie DWiwfs(DTI)) and applies the Single Shell Free Water Elimination Diffusion Tensor Model "Free Runner" available from: https://github.com/sameerd/DiffusionTensorImaging. The result of this step is a skull stripped DWI Nifti from which the free water has been removed, referred to as DWiwfswr(DTI). Optionally, the step 619 further generates white matter tracts DWiwmt(DTI) from DWiwfswr(DTI) using the Constrained Spherical Deconvolution (CSD) method available from https://dipy.org/documentation/1.0.0./examples_built/reconst_csd/. The output DWiwmt(DTI) of this step is a file containing all the white matter tracts of the particular brain to be parcellated Bbp.

Figure 7:
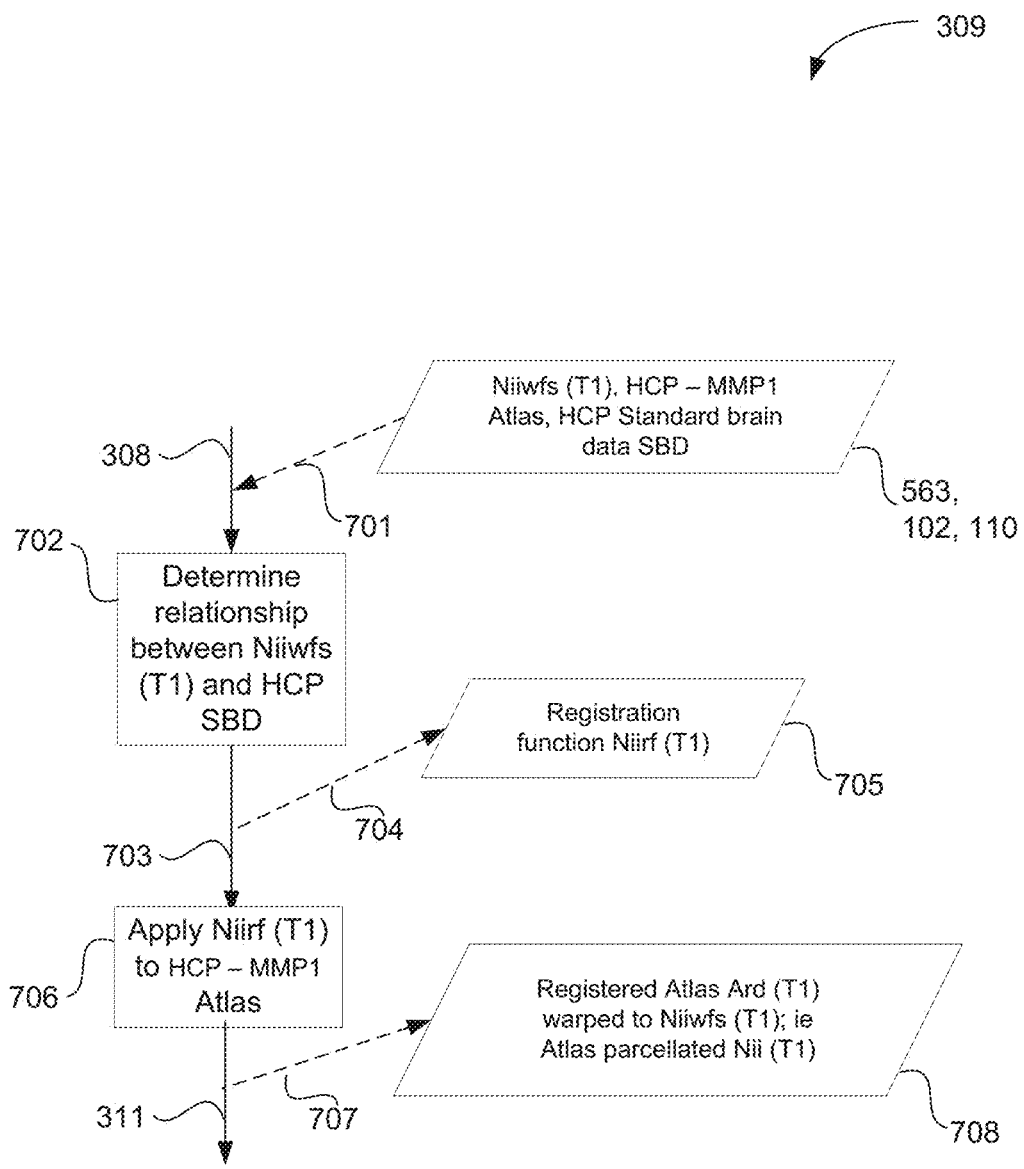
FIG. 7 is a process flow chart example of how the Atlas registration step 309 of FIG. 3 can be performed.

FIG. 7 is a process flow chart example 309 of how the Atlas registration step 309 of FIG. 3 can be performed. A step 702, performed by the processor 205 executing the PAA software program 233, receives Niiwfs(T1) (i.e., Registration function—see 563), the HCP-MMP1 Atlas (see 102), and the HCP standard brain data SBD (see 110) and determines a relationship between Niiwfs(T1) and HCB-SDB to thereby output the registration function Niirf(T1) (ie see 705) for the particular brain in a Montreal Neurological Institute (MNI) space described by a set of standard brain data image sets (110). Accordingly, the step 702 determines a relationship between the masked, skull and face stripped T1 image Niiwfs (T1) and the set of standard brain data image sets to generate the registration function. Stated differently, a registration function is typically applied to objects that are similar. The standard brain HCP has no skull, but the patient brain has one. Thus, it is difficult to register one to the other. One approach is to remove the skull from the patient brain so that it can be mapped onto the standard brain. However, one typically wants to display the patient's brain with the skull. Since the skull stripped brain is the patient's brain minus the skull, we can use the mapping learned skull stripped—standard brain (called registration function) and apply it on the brain with the skull. As a result, the standard brain and the patient's brain with the skull are now registered.

A following step 706, performed by the processor 205 executing the PAA software program 233, applies Niirf(T1) to HCP-MMP1 Atlas to thereby output the registered Atlas Ard(T1) (see 708). Accordingly, the step 706 determines the registered atlas Ard(T1) from the HCP-MMP1 Atlas 102 containing a standard parcellation scheme and the registration function. The step 706 determines the registered atlas by applying the registration function to the HCP-MMP1 Atlas to generate the registered atlas. Stated differently, the end output T1 includes skull data. The HCP brain as well as the DTI scan don't have skull data, so the registration can only be done on skull-less input. The input T1 needs therefore to be skull stripped for registering DTI and T1 together. However, as an end output, that T1 should include skull data, so one approach is: 1) Skull strip the T1 data; 2) register the T1 and DTI through HCP; and 3) Go back to the original T1 and use the function found on its skull-less version to obtain the original T1 data. In certain implementations, a standard HCP-MMP atlas, after conversion to a volumetric format such as NIFTI, can be loaded and fitted to the T1 data of the subject brain using fitting mechanisms such as curve fitting techniques, least squares fitting techniques, or volumetric fitting.

Figure 8A:
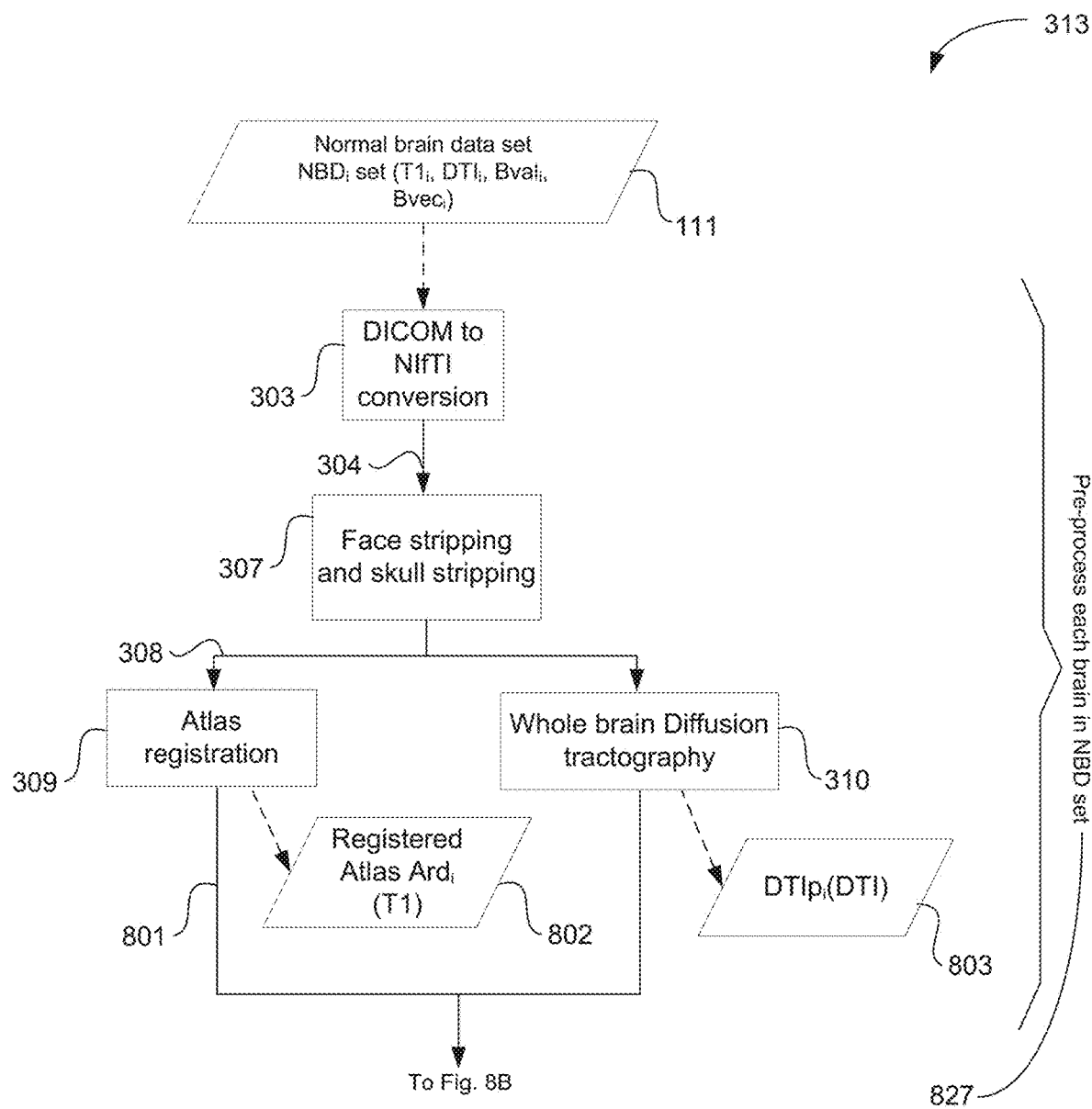
FIGS. 8A and 8B are process flow chart fragments depicting how the parcellation adjustment training module 313 of FIG. 3 can be implemented.
Figure 8B:
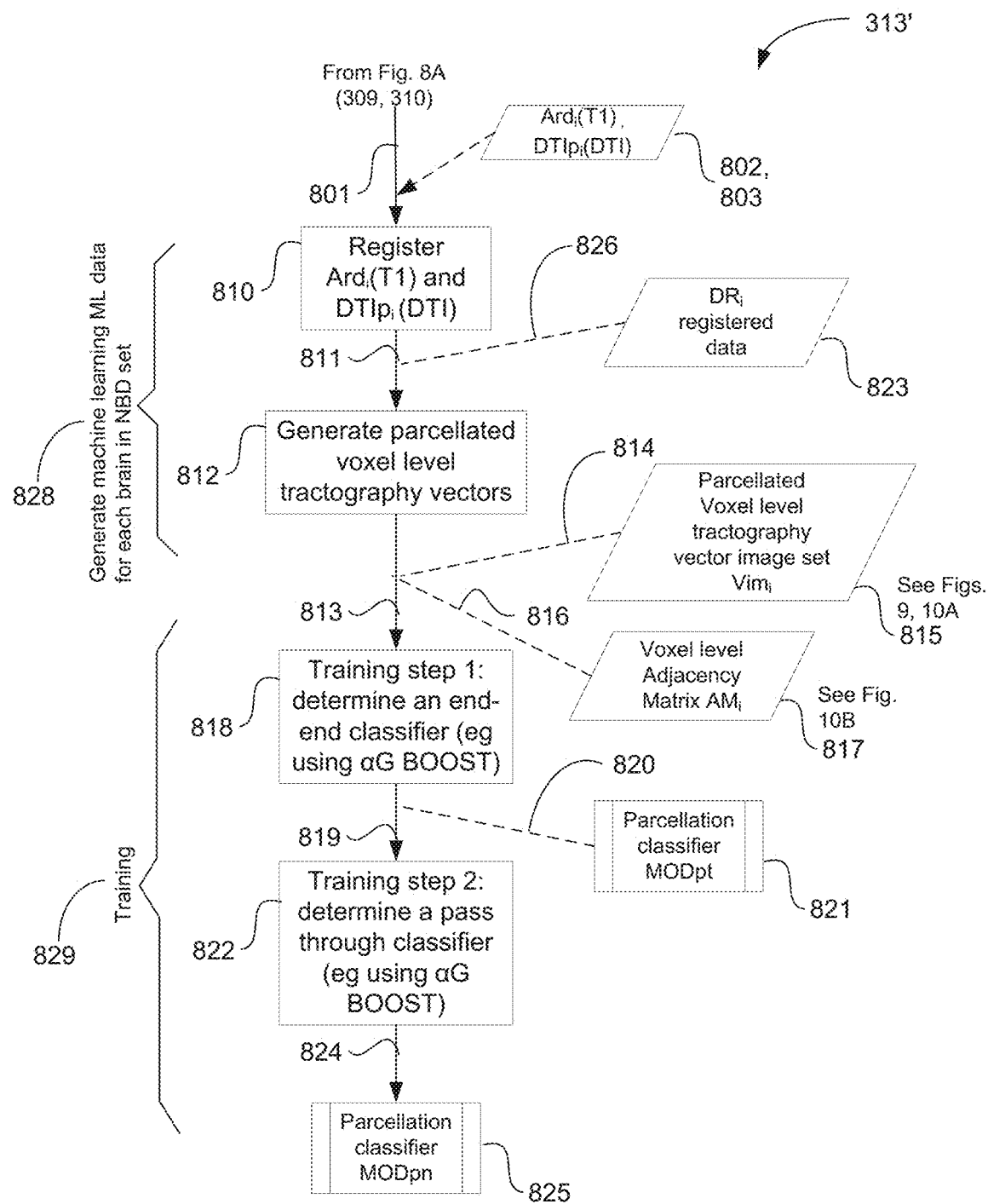

FIGS. 8A and 8B are process flow chart fragments 313 and 313' which depict how the parcellation adjustment training module 313 of FIG. 3 can be implemented.

In FIG. 8A a step 303, performed by the processor 205 executing the PAA software program 233, receives the p normal brain data sets NBDi each comprising T1$i$, DTH, Bval$i$ and Bvec$i$, where 1<i<p (see 111). Processing steps 111, 303, 307, 309 and 310 (in FIG. 8A) and processing steps 810 and 812 (in FIG. 8B) are performed for each of the p normal brain data sets NBDi. Processing steps 818 and 822 in FIG. 8B are performed once, after all the p sets of normal brain data sets NBDi at 111 have been processed.

A step 303, performed by the processor 205 executing the PAA software program 233, performs DICOM to NIfTI conversion (see the step 303 in FIG. 3 for details). A following step 307, performed by the processor 205 executing the PAA software program 233, performs face stripping and skull stripping (see the step 307 in FIG. 3 for details). A following step 309, performed by the processor 205 executing the PAA software program 233, performs atlas registration (see the step 309 in FIG. 3 for details) to thereby output registered atlas Ardi(T1) (see 802). A following step 310, depicted in this example as being performed in parallel with the step 309, performed by the processor 205 executing the PAA software program 233, performs whole brain diffusion tractography (see the step 310 in FIG. 3 for details) to thereby output a corresponding whole brain tractography image set DTIPi(DTI) (see 803). This is a preprocessing phase 827.

In FIG. 8B, a step 810, performed by the processor 205 executing the PAA software program 233, receives the registered Atlas Ardi(T1) (see 802) and the whole brain tractography image set DTIPi(DTI) (see 803) and registers the Ardi(T1) and the DTIPi(DTI) to thereby output registered data DRi (ie Registered data between Ardi(T1) and DTIpi(DTI)—see 823). A following step 812, performed by the processor 205 executing the PAA software program 233, generates parcellated voxel level tractography vectors Vimi (ie Voxel level parcellation to tractography vector image set for brain in ith NBD set—see 815) and a voxel level adjacency matrix Ami (ie Voxel level adjacency matrix for brain in ith NBD set—see 817). This is a machine learning data generation phase 828. In other words, Each voxel is categorised which provide the parcellation identity. A collection of identified voxels can be associated with a parcellation. Furthermore, each voxel is given an identity. For each voxel, the system can also determine which tracts are starting in that specific voxel and where they are ending. Based on that information, the system can create an adjacency table/feature vector where the row label is equal to the target voxel identity and each column label in the corresponding columns is the respective voxel to which the row voxel connects. The value populating a cell is the normalised number of tracts between the respective pair of voxels.

A following step 818, performed by the processor 205 executing the PAA software program 233, determines the end-to-end parcellation classifier MODpt (see 821) using, for example, a machine-learning model such as the PYTHON library XG BOOST module. A following step 822, performed by the processor 205 executing the PAA software program 233, determines the pass-through parcellation classifier MODpn (see 825) using, for example, the aforementioned aG BOOST module. This is a training phase 829.

Figure 9:
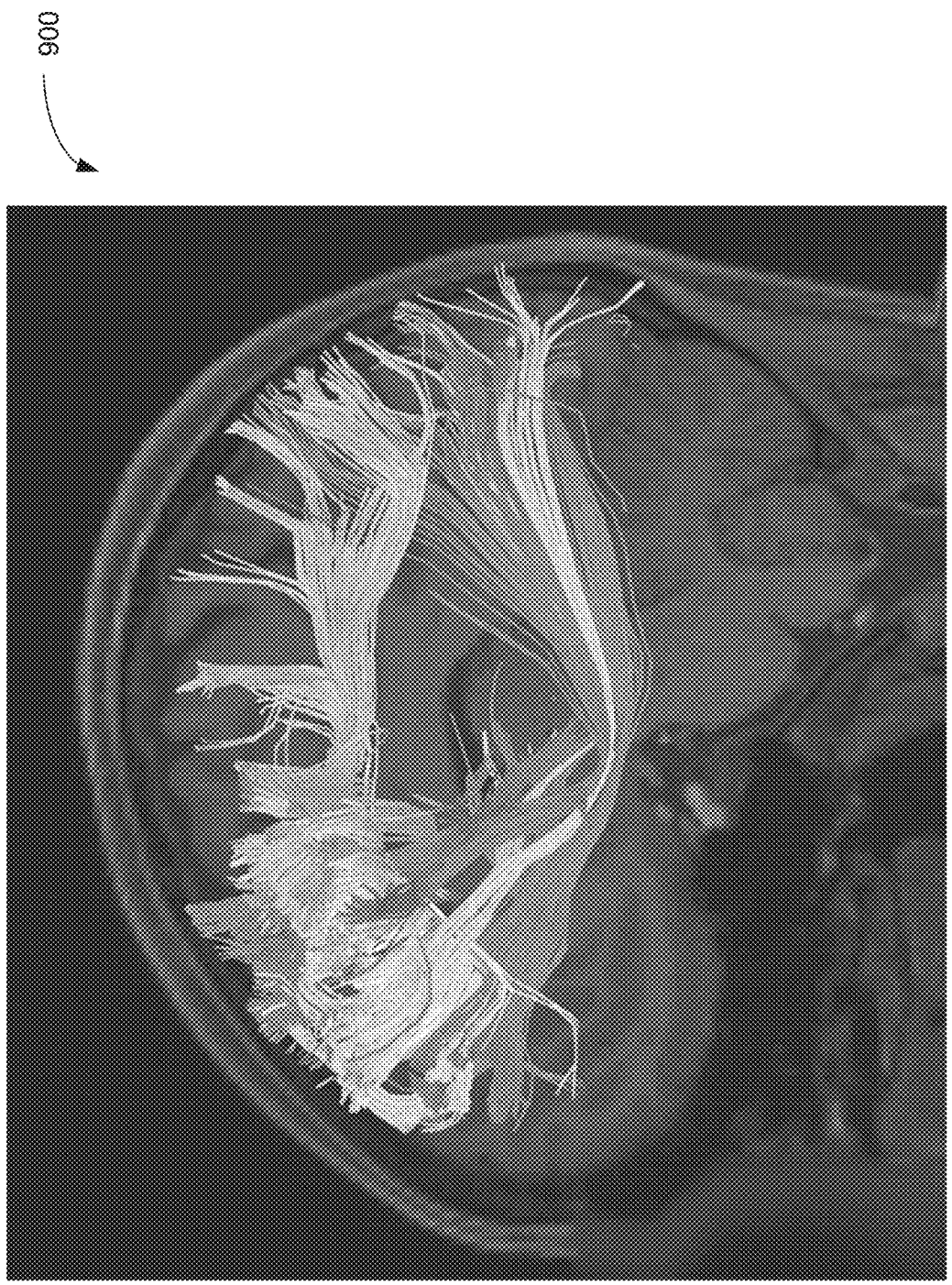
FIG. 9 depicts an actual image of voxel level tractography vectors (also referred to as "tracts") overlaid on a T1 image.

FIG. 9 depicts an actual T1 image of voxel level tractography vectors (eg see 1123 in FIG. 4).

FIGS. 10A and 10B depict illustrative voxel level tractography vectors showing connectivity of voxels. For example, in FIG. 10A a vector "ab" (ie 1005) connects voxels "a" (ie 1004) and "b" (ie 1003) and a vector "ac" (ie 1002) connects voxels "a" (ie 1004) and "c" (ie 1001).

FIG. 10C depicts a relationship, in table form, between parcellations, voxel parcellation identities and voxel level tractography vectors. In FIG. 10C each row represents a voxel. Row labels represent the parcellations to which the voxels belong. Columns represent the parcellations to which the voxel connects. The table cell values represent the number of tracts between the voxel and a parcellation.

Figure 11A:
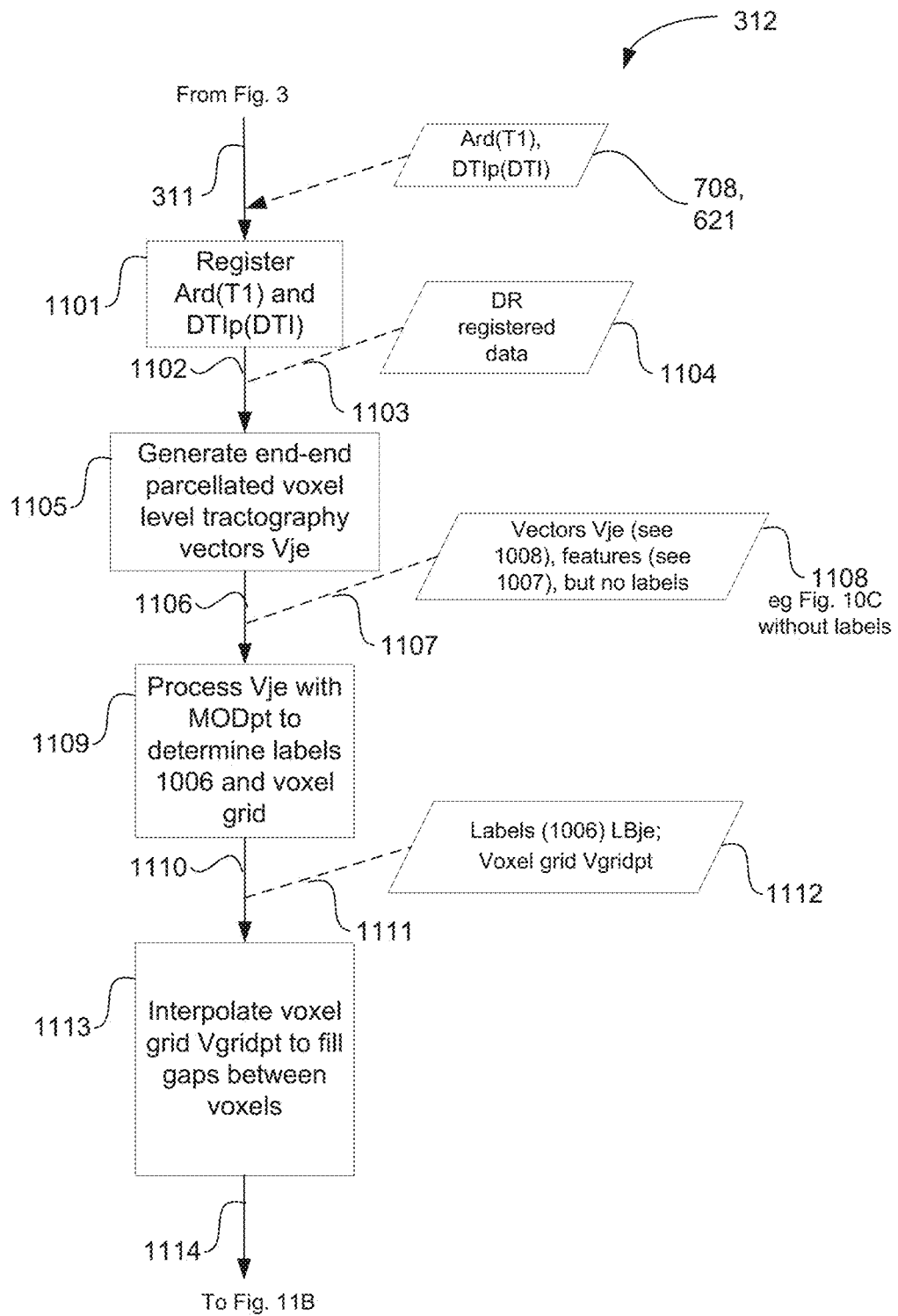
FIGS. 11A and 11B are process flow chart fragments depicting how the parcellation adjustment step 312 of FIG. 3 can be implemented.
Figure 11B:
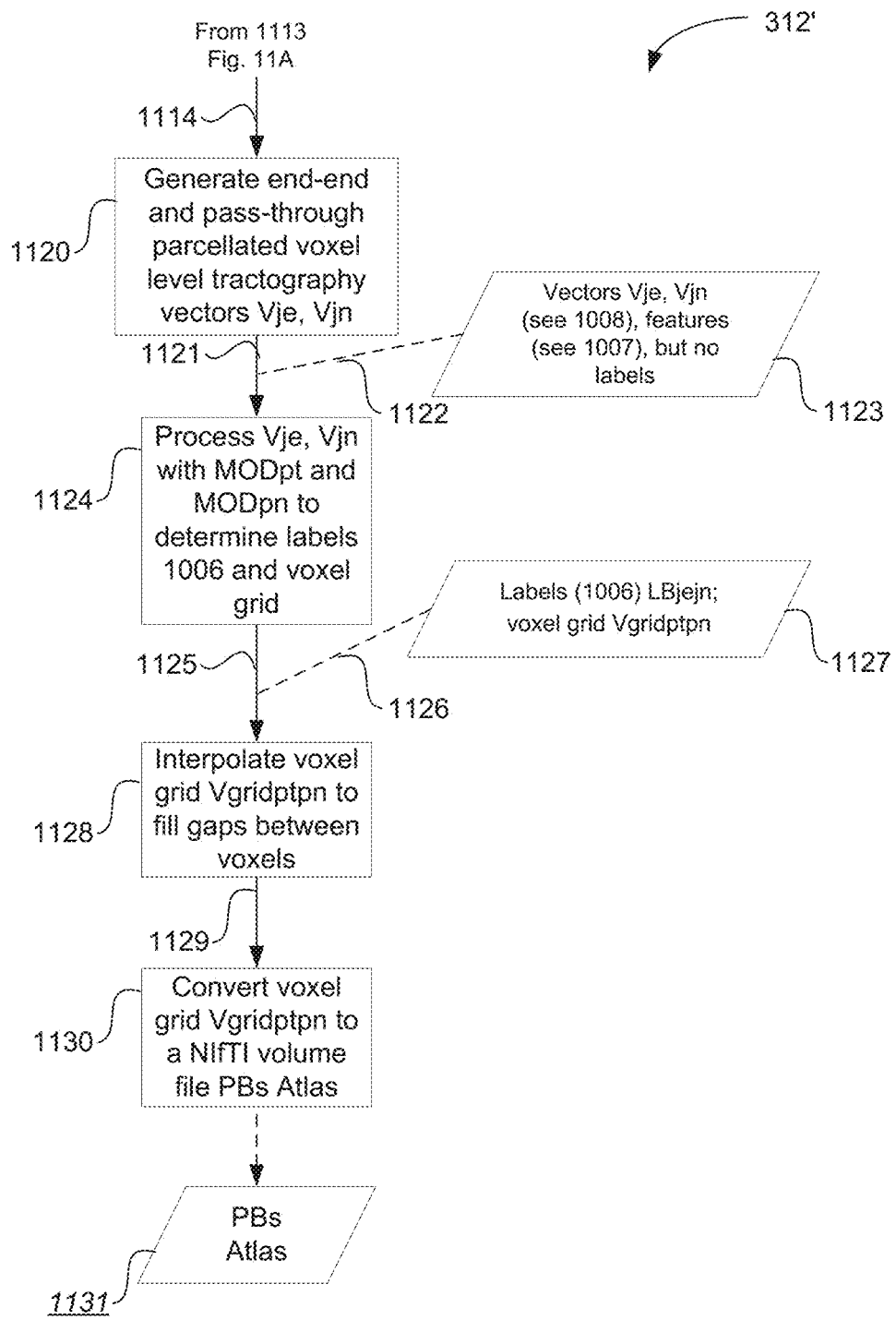

FIGS. 11A and 11B are process flow chart fragments 312 and 312' depicting how the parcellation adjustment step 312 of FIG. 3 can be implemented.

In FIG. 11A a step 1101, performed by the processor 205 executing the PAA software program 233, registers Ard(T1) and DTIp(DTI) to thereby output registered data DR (ie Registered data Between Ard(T1) and DTIp(DTI)—see 1104). The step 1101 receives as inputs the registered atlas Ard(T1) and the tractography image set DTIp(DTI) (see 708 and 621). A following step 1105, performed by the processor 205 executing the PAA software program 233, generates end-to-end parcellated voxel level tractography vectors to thereby output vectors Vje (ie End-to-end parcellated voxel level tractography vectors generated using HCP-MMP1 Atlas) such as 1008 which have features/parcellations such as 1007 but no labels. Accordingly, for each voxel in a particular parcellation in the registered atlas Ard(T1), the step 1105 determines end-to-end voxel level tractography vectors Vje showing end-to-end connectivity of the voxel with voxels in other parcellations. More particularly, the step 1105 generates end-to-end parcellated voxel level tractography vectors Vje, and generates end-to-end and pass-through parcellated voxel level tractography vectors Vjn. A following step 1109, performed by the processor 205 executing the PAA software program 233, processes Vje with MODpt to thereby output labels LBje (ie Labels associated with tractography vectors Vje) such as 1006 and a voxel grid Vgridpt (ie Voxel grid generated by processing Vje with MODpt—see 1112). Accordingly, the step 1109 classifies, for each voxel, the voxel to determine labels LBje and a voxel grid Vgridpt for end-to-end parcellated voxel level tractography vectors, based on the probability of the voxel being part of the particular parcellation. A following step 1113, performed by the processor 205 executing the PAA software program 233, performs interpolation of the voxel grid Vgridpt to fill gaps between voxels.

In FIG. 11B a step 1120, performed by the processor 205 executing the PAA software program 233, generates end-to-end and pass-through parcellated voxel level tractography vectors to thereby output vectors Vje (ie End-to-end parcellated voxel level tractography vectors generated using HCP-MMP1 Atlas) and Vjn (ie Pass-through parcellated voxel level tractography vectors generated using HCP-MMP1 Atlas), which have features but no labels (see 1123). Accordingly, the step 1120 determines end-to-end voxel level tractography vectors Vje and pass-through parcellated voxel level tractography vectors Vjn respectively showing end-to-end and pass-through connectivity of the voxel with voxels in other parcellations. A following step 1124, performed by the processor 205 executing the PAA software program 233, processes Vje and Vjn with MODpt and MODpn to thereby output labels LBjejn (ie Labels associated with tractography vectors Vje and Vjn) and a voxel grid Vgridptpn (ie Voxel grid generated by processing Vje, Vjn with MODpt and MODpn—see 1127). Accordingly, the step 1124 classifies the voxel to determine labels LBjejn and a voxel grid Vgridptpn for end-to-end parcellated voxel level tractography vectors and pass-through parcellated voxel level tractography vectors, based on the probability of the voxel being part of the particular parcellation. A following step 1128, performed by the processor 205 executing the PAA software program 233, performs interpolation of the voxel grid Vgridptpn to fill gaps between voxels. Accordingly, the step 1128 interpolates the voxel grid Vgridptpn for end-to-end parcellated voxel level tractography vectors and pass-through parcellated voxel level tractography vectors to fill gaps between voxels. A following step 1130, performed by the processor 205 executing the PAA software program 233, converts the voxel grid Vgridptpn to the Personalised brain Atlas (PBs Atlas) (see 1131). This conversion is simply a matter of taking all individual parcellations and placing them in a single tensor. That tensor can be saved in various format, one of which is an object usable for viewing. As previously described, the process of determining the voxel grid and predicting the parcellation can be performed using two passes. In a first pass, prediction is performed using MODpt. In a second pass, prediction is performed using MODpn. This two-pass process outputs two sets of predictions which may not provide the same prediction (ie the first-pass prediction may conflict with the second-pass prediction). Such conflicts need to be resolved and in one PAA example conflict is resolved as follows: if the first-pass predicts a value A, and the second-pass predicts a value B for the same parcellation, then the first pass result is maintained and the second-pass result is discarded.

Figure 12:
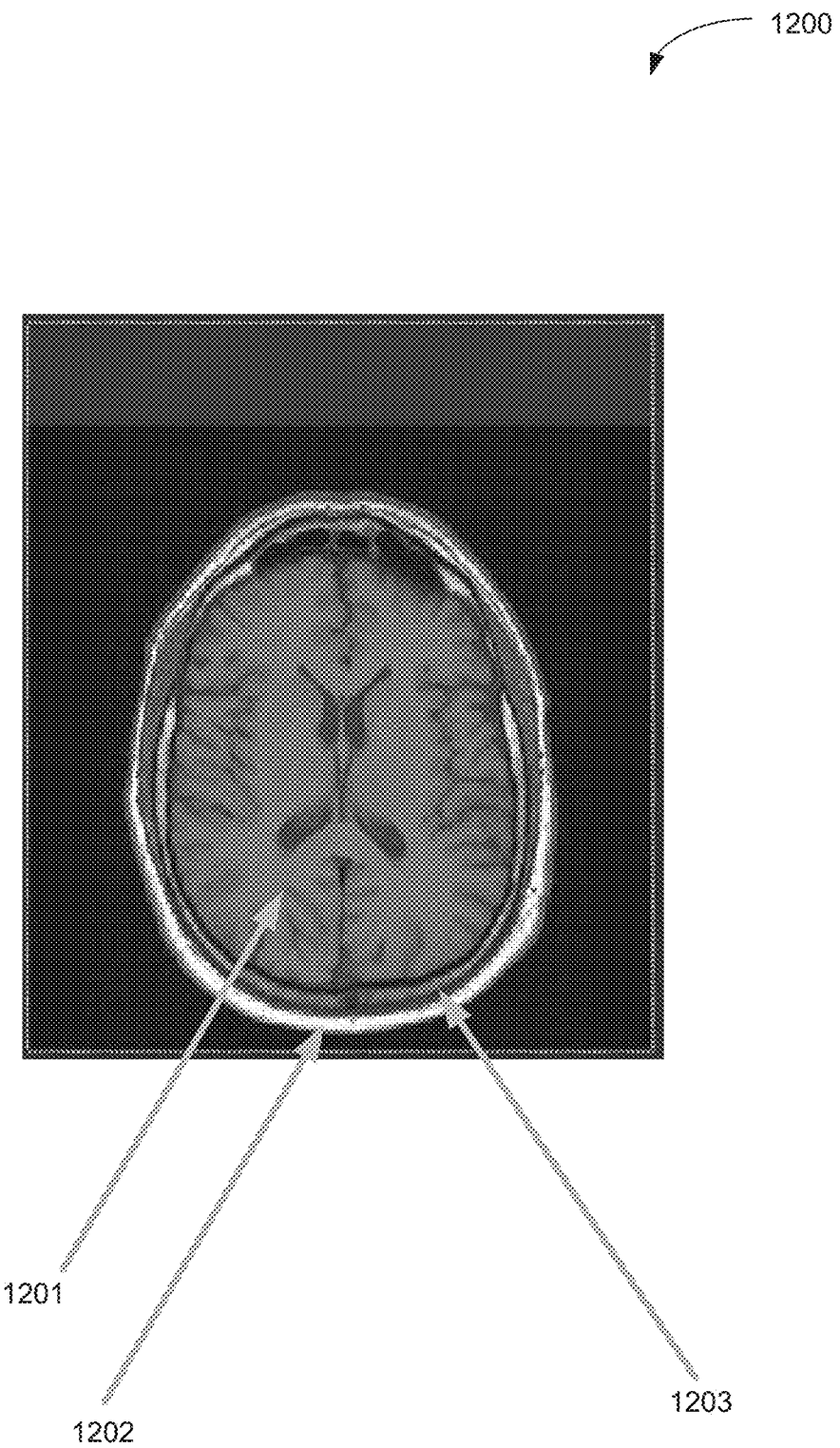
FIG. 12 depicts a brain to be parcellated.

FIG. 12 depicts a brain to be parcellated. The PAA arrangement requires that the brain 1201 be processed after stripping away image information relating to the face 1202 and the skull 1203.

INDUSTRIAL APPLICABILITY

The arrangements described are applicable to the computer and data processing industries and particularly for the medical imaging industry.

The systems and methods described in this specification can provide a remapping of a parcellation's boundaries in patients with various brain structures using a novel machine learning-based approach. In healthy patients, this approach creates an atlas which is similar to that obtained with pure affine based registration, but with interpersonal variability. In patients with potentially unhealthy or definitively unhealthy brains, such as those with brain tumors, atrophy or hydrocephalus, this creates an atlas accounting for anatomical distortion and potentially for functional reorganization. This raises the possibility that patients who have undergone brain surgery, have brain tumors, a traumatic brain injury, stroke, or other brain distorting diseases might be able to be studied with more formal connectomic based methods. It also provides the possibility to compare data in a meaningful way across patients to gain insight into injury and repair in patients in both research and non-research settings. Further, these techniques can be used in clinical practice in that it is fast and automated.

In other words, atlasing techniques described in this specification and based on structural connectivity are robust to structural and shape changes seen in pathologic states. This is because the outlined methodology excels at informing where specific brain circuits are located, with the reasonable subsequent hypothesis that a specific set of connections perform a similar function if it is physically displaced elsewhere.

To impact and improve clinical care, neuroimaging processing and analysis needs to be fast, automated, and able to handle pathologic brain anatomy in a robust and biologically accurate way. One benefit of the approaches described in this specification is that they are fast, do not require human input, and can address abnormal brains. Methods which cannot accomplish processing in a clinically realistic timeline and without expert input, do not scale to the greater clinical neuroscience community.

The methods described in this specification makes do not make assumptions about spherical shape or cortical topology and use connectivity data to define gray matter structures and parcellation location. Thus, these methods are more versatile and faster, making them more clinically realistic and robust to complex patients.

Image preprocessing for DT and fMRI images with some of the most popular platforms can take at least several hours to produce useable results especially for abnormal brains. The methods and systems described in this specification have advantages for clinical neuro-oncology practice where the data is required quickly due to some patients needing surgery immediately. The methods and systems described in this specification can produce actionable results in less than one hour, including processing resting-state fMRI, which is advantageous, in both a clinical setting with patients who require fast and accurate imaging analysis, in particular in cases of brain tumors, and in a research setting, wherein data can be collected and analyzed more efficiently.

Furthermore, prior platforms and tools that are available to process and analyze DT and fMRI images are poorly automated and integrated. Presently, most tools require some coding and/or shell scripting. Given that most people in charge of patient care are physicians, not computer scientists, this requires in-house expertise, which is not scalable in terms of work force, cost, and/or meeting the timelines of clinical practice. Further, in the research setting, it is more cost- and time-effective for the processing and analysis to be automated. The methods and systems described in this specification are more efficient and practical when compared to previous techniques.

The foregoing describes only some embodiments of the present invention, and modifications and/or changes can be made thereto without departing from the scope and spirit of the invention, the embodiments being illustrative and not restrictive.

The invention claimed is:

1. A method comprising:
   obtaining brain tractography data of a particular brain;
   determining a registration function for the brain tractography data of the particular brain in a three dimensional coordinate system space;
   determining a registered atlas from the registration function and a standard Atlas containing a standard parcellation scheme;
   for at least one voxel in a particular parcellation in the registered atlas:
      determining end-to-end voxel level tractography vectors showing end-to-end connectivity of the voxel with voxels in other parcellations;
      determining pass-through parcelleted voxel level tractography vectors;
      classifying the voxel to determine labels and a voxel grid for end-to-end parcellated voxel level tractography vectors, based on probability of the voxel being part of the particular parcellation; and
   repeating the determining of the end-to-end voxel level tractography vectors and the classifying of the voxels for a plurality of parcellations of the registered atlas to form a personalised brain atlas containing an adjusted parcellation scheme reflecting the particular brain.

2. The method according to claim 1, further comprising, prior to the repeating step, the step of interpolating the voxel grid for end-to-end parcellated voxel level tractography vectors to fill gaps between voxels.

3. The method according to claim 2, further comprising, for each voxel in a particular parcellation in the registered atlas:
   determining end-to-end voxel level tractography vectors and pass-through parcellated voxel level tractography vectors respectively showing end-to-end and pass-through connectivity of the voxel with voxels in other parcellations;
   classifying the voxel to determine labels and a voxel grid for end-to-end parcellated voxel level tractography vectors and pass-through parcellated voxel level tractography vectors, based on the probability of the voxel being part of the particular parcellation; and
   interpolating the voxel grid for end-to-end parcellated voxel level tractography vectors and pass-through parcellated voxel level tractography vectors to fill gaps between voxels.

4. The method according to claim 1, wherein the step of determining the registration function for the particular brain in the three dimensional coordinate system space comprises the steps of:
   performing face stripping, skull stripping and masking of a NIfTI version of T1 images of brain image data to obtain a masked, skull and face stripped T1 image; and
   determining a relationship between the masked, skull and face stripped T1 image and a set of standard brain data image sets to generate the registration function.

5. The method according to claim 1, wherein the step of determining the registered atlas comprises applying the registration function to the standard Atlas to generate the registered atlas.

6. The method according to claim 1, wherein the method further includes performing diffusion tractography on brain image data performed in relation to a face stripped masked NIfTI version of DTI images of a DICOM image set.

7. The method according to claim 1, wherein the determining of the voxel level tractography vectors comprises the steps of:
   registering the registered Atlas and a brain tractography image set; and
   generating end-to-end parcellated voxel level tractography vectors.

8. The method according to claim 1, wherein classifying the voxel comprises processing the end-to-end parcellated voxel level tractography vectors and the pass-through parcellated voxel level tractography vectors with an end-to-end classifier and a pass-by classifier to form the voxel grid.

9. The method according to claim 1, wherein the plurality of parcellations comprises all parcellations in the registered atlas.

10. The method according to claim 1, wherein the three dimensional coordinate system space is Montreal Neurological Institute space described by a set (HCP-SDB) of standard brain data image sets.

11. The method according to claim 1, wherein the standard Atlas is a HCP-MMP1 Atlas.

12. The method of claim 1, wherein the brain tractography data of the particular brain are whole brain tractography images of the particular brain.

13. A system comprising:
   one or more computers and one or more storage devices on which are stored instructions that are operable, when executed by the one or more computers, to cause the one or more computers to perform operations comprising:

obtaining brain tractography data for a particular brain;

determining a registration function for the brain tractogrpahy data of the particular brain in a specified space;

determining a registered atlas from the registration function and a standard Atlas containing a standard parcellation scheme;

for at least one voxel in a particular parcellation in the registered atlas:

determining end-to-end voxel level tractography vectors showing end-to-end connectivity of the voxel with voxels in other parcellations;

determining pass-through parcellated voxel level tractography vectors; and classifying the voxel to determine labels and a voxel grid for end-to-end parcellated voxel level tractography vectors, based on probability of the voxel being part of the particular parcellation; and repeating the determining of the end-to-end voxel level tractography vectors and the classifying of the voxels for a plurality of parcellations of the registered atlas to form a personalised brain atlas containing an adjusted parcellation scheme reflecting the particular brain.

14. The system according to claim 13, wherein the operations further comprise, prior to the repeating step, the step of interpolating the voxel grid for end-to-end parcellated voxel level tractography vectors to fill gaps between voxels.

15. The system according to claim 13, wherein the step of determining the registered atlas comprises applying the registration function to the standard Atlas to generate the registered atlas.

16. The system according to claim 13, wherein operations further comprise the step of performing diffusion tractography on brain image data performed in relation to a face stripped masked NIfTI version of DTI images of a DICOM image set.

17. The system according to claim 13, wherein the plurality of parcellations comprises all parcellations in the registered atlas.

18. The system according to claim 13, wherein the determining of the voxel level tractography vectors comprises the steps of:

registering the registered Atlas and a brain tractography image set; and generating end-to-end parcellated voxel level tractography vectors.

19. A computer readable storage medium having one or more computer programs recorded therein, the one or more programs being executable by a computer apparatus to make the computer apparatus perform a method of processing brain image data of a particular brain to be parcellated, the method comprising the steps of:

obtaining brain tractography data of a particular brain;

determining a registration function for the brain tractography data of the particular brain in a three dimensional coordinate system space;

determining a registered atlas from the registration function and a standard Atlas containing a standard parcellation scheme;

for at least one voxel in a particular parcellation in the registered atlas:

determining end-to-end voxel level tractography vectors showing end-to-end connectivity of the voxel with voxels in other parcellations;

determining pass-through parcellated voxel-level tractography vectors;

classifying the voxel to determine labels and a voxel grid for end-to-end parcellated voxel level tractography vectors, based on probability of the voxel being part of the particular parcellation; and repeating the determining of the end-to-end voxel level tractography vectors and the classifying of the voxels for a plurality of parcellations of the registered atlas to form a personalised brain atlas containing an adjusted parcellation scheme reflecting the particular brain.

* * * * *